United States Patent
Chou et al.

(10) Patent No.: US 11,552,595 B2
(45) Date of Patent: Jan. 10, 2023

(54) ALL ELECTRICAL FULLY CONNECTED COUPLED OSCILLATOR ISING MACHINE

(71) Applicant: Massachusetts Institute of Technology, Cambridge, MA (US)

(72) Inventors: Jeffrey Chou, Walnut Creek, CA (US); Suraj Deepak Bramhavar, Arlington, MA (US); Christopher Roberts, Amesbury, MA (US); Christopher A. D. Roeser, Concord, MA (US); Siddhartha Ghosh, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 87 days.

(21) Appl. No.: 17/007,649

(22) Filed: Aug. 31, 2020

(65) Prior Publication Data
US 2021/0152125 A1 May 20, 2021

Related U.S. Application Data

(60) Provisional application No. 62/928,110, filed on Oct. 30, 2019.

(51) Int. Cl.
*H03B 5/08* (2006.01)
*H03B 5/18* (2006.01)
(Continued)

(52) U.S. Cl.
CPC ........... *H03B 19/14* (2013.01); *H03B 5/1215* (2013.01); *H03B 2200/008* (2013.01); *H03B 2200/0074* (2013.01)

(58) Field of Classification Search
CPC ............. H03B 19/14; H03B 5/1215; H03B 2200/0074; H03B 2200/008; H03B 5/1228
(Continued)

(56) References Cited

U.S. PATENT DOCUMENTS

| 2014/0159782 A1 | 6/2014 | Kennedy et al. |
| 2014/0266892 A1 | 9/2014 | Schiller |

(Continued)

OTHER PUBLICATIONS

Belongie, "Spin glasses and error-correcting codes." The Telecommunications and Data Acquisition Progress Report 42 (1994). 11 pages.

International Search Report and Written Opinion in International Patent Application No. PCT/US2020/048749 dated Jun. 28, 2021, 10 pages.

(Continued)

*Primary Examiner* — Richard Tan
(74) *Attorney, Agent, or Firm* — Smith Baluch LLP

(57) ABSTRACT

Networks of superharmonic injection-locked (SHIL) electronic oscillators can be used to emulate Ising machines for solving difficult computational problems. The oscillators can be simulated or implemented in hardware (e.g., with LC oscillators) and are coupled to each other with links whose connection strengths are weighted according to the problem being solved. The oscillators' phases may be measured with respect to reference signal(s) from one or more reference oscillators, each of which emits a reference signal but does not receive input from any other oscillator. Sparsely connected networks of SHIL oscillators and reference oscillators can be used as Viterbi decoders that do not suffer from the information bottleneck between logic computational blocks and memory in digital computing systems. Sparsely connected networks of SHIL oscillators and reference oscillators can also be programmed to act as Boolean logic gates that operate in both forward and backward directions, enabling multipliers that can factor numbers.

15 Claims, 21 Drawing Sheets

(51) Int. Cl.
H03B 19/14 (2006.01)
H03B 5/12 (2006.01)
(58) Field of Classification Search
USPC .......................................................... 331/167
See application file for complete search history.

(56) References Cited

U.S. PATENT DOCUMENTS

| | | | |
|---|---|---|---|
| 2015/0091617 | A1 | 4/2015 | Zerbe et al. |
| 2016/0162798 | A1 | 6/2016 | Marandi et al. |
| 2017/0104493 | A1 | 4/2017 | Goto |

OTHER PUBLICATIONS

Wang et al., "OIM: Oscillator-based Ising machines for solving combinatorial optimisation problems." International Conference on Unconventional Computation and Natural Computation. Springer, Cham, 2019. 20 pages.

Whitfield et al., "Ground-state spin logic." EPL (Europhysics Letters) 99.5 (2012): 57004. 9 pages.

"Viterbi Decoding of Convolutional Codes," MIT 6.02 Draft Lecture Notes, Lecture 9, Fall 2010 (Last update: Oct. 6, 2010), Accessed at http://web.mit.edu/6.02/www/f2010/handouts/lectures/L9.pdf. 11 pages.

Acebrón et al., "The Kuramoto model: A simple paradigm for synchronization phenomena." Reviews of Modern Physics 77.1 (2005): 137. 49 pages.

Albash et al., "Analog errors in Ising machines." Quantum Science and Technology 4.2 (2019): 02LT03. 8 pages.

Aramon et al., "Physics-inspired optimization for constraint-satisfaction problems using a digital annealer." arXiv preprint arXiv: 1806.08815 (2018). 15 pages.

Bhansali et al., "Gen-Adler: The generalized Adler's equation for injection locking analysis in oscillators," 2009 Asia and South Pacific Design Automation Conference, Yokohama, 2009, pp. 522-527, doi: 10.1109/ASPDAC.2009.4796533.

Cai et al., "Harnessing intrinsic noise in memristor Hopfield neural networks for combinatorial optimization." arXiv preprint arXiv:1903. 11194 (2019). 24 pages.

Camsari et al., "Stochastic p-bits for invertible logic." Physical Review X 7.3 (2017): 031014. 19 pages.

Chancellor et al. "A direct mapping of max k-SAT and high order parity checks to a Chimera graph." Scientific Reports 6 (2016): 37107. 9 pages.

Chou et al., "Analog Coupled Oscillator Based Weighted Ising Machine," arXiv: 1906.06312v1 [physics.comp-ph], 13 pages (Jun. 14, 2019).

Chou et al., "Analog Coupled Oscillator Based Weighted Ising Machine," arXiv:1906.06312v2 [physics.comp-ph], 15 pages (Submitted on Jun. 14, 2019 (v1), last revised Aug. 27, 2019 (this version, v2)).

Di Ventra et al., "Perspective: Memcomputing: Leveraging memory and physics to compute efficiently." Journal of Applied Physics 123.18 (2018): 180901. 16 pages.

Di Ventra et al., "The parallel approach." Nature Physics 9.4 (2013): 200-202.

Dörfler et al., "Synchronization in complex networks of phase oscillators: A survey." Automatica 50.6 (2014) 1539-1564.

Fang et al., "Pattern recognition with "materials that compute"." Science Advances 2.9 (2016): e1601114. 11 pages.

Guo et al., "Modeling and experimental demonstration of a Hopfield network analog-to-digital converter with hybrid CMOS/memristor circuits." Frontiers in Neuroscience 9 (2015): 488. 8 pages.

Hamerly et al., "Scaling advantages of all-to-all connectivity in physical annealers: the Coherent Ising Machine vs. D-Wave 2000Q." arXiv preprint arXiv:1805.05217 (2018). 17 pages.

Haribara et al., "A coherent Ising machine for MAX-CUT problems: performance evaluation against semidefinite programming and simulated annealing." Principles and Methods of Quantum Information Technologies. Springer, Tokyo, 2016. 251-262.

Hopfield et al., "Computing with neural circuits: A model." Science 233.4764 (1986): 625-633.

Huang, Go Speed Racer . . . Arduino Speed Test. Sparkfun Dec. 18, 2014. Accessed at https://learn.sparkfun.com/blog/1687 on Apr. 20, 2020. 9 pages.

Inagaki et al., "A coherent Ising machine for 2000-node optimization problems." Science 354.6312 (2016): 603-606.

International Search Report and Written Opinion in International Patent Application No. PCT/US2020/025271 dated Aug. 6, 2020, 11 pages.

Johnson et al., "Quantum annealing with manufactured spins." Nature 473.7346 (2011): 194-198.

King et al., "Emulating the coherent Ising machine with a mean-field algorithm." arXiv:1806.08422 (2018), 5 pages.

Leleu et al., "Destabilization of local minima in analog spin systems by correction of amplitude heterogeneity" Physical Review Letters 122.4 (2019): 040607. 6 pages.

Li et al., "Analogue signal and image processing with large memristor crossbars." Nature Electronics 1.1 (2018): 52. 8 pages.

Lucas, "Ising formulations of many NP problems." Frontiers in Physics 2 (2014): 5. 15 pages.

Maffezzoni et al., "Oscillator Array Models for Associative Memory and Pattern Recognition," in IEEE Transactions on Circuits and Systems I: Regular Papers, vol. 62, No. 6, pp. 1591-1598, Jun. 2015. 9 pages.

McMahon et al., "A fully programmable 100-spin coherent Ising machine with all-to-all connections." Science 354.6312 (2016): 614-617.

Mirzaei et al., "The quadrature LC oscillator: A complete portrait based on injection locking." IEEE Journal of Solid-State Circuits 42.9 (2007): 1916-1932.

Nigg et al., "Robust quantum optimizer with full connectivity." Science Advances 3.4 (2017): e1602273. 8 pages.

Parihar et al., "Computing with dynamical systems based on insulator-metal-transition oscillators." Nanophotonics 6.3 (2017): 601-611.

Puri et al., "Quantum annealing with all-to-all connected nonlinear oscillators." Nature Communications 8.1 (2017): 1-9.

Rategh et al., "Superharmonic injection-locked frequency dividers." IEEE Journal of Solid-State Circuits 34.6 (1999) 813-821.

Rendl et al., "Solving max-cut to optimality by intersecting semidefinite and polyhedral relaxations." Mathematical Programming 121.2 (2010): 307. 29 pages.

Shin et al., "Hardware acceleration of simulated annealing of spin glass by RRAM crossbar array." 2018 IEEE International Electron Devices Meeting (IEDM). IEEE, 2018. 4 pages.

Smith, "Neural networks for combinatorial optimization: a review of more than a decade of research." INFORMS Journal on Computing 11.1 (1999): 15-34.

Strzelecka et al., "Parallel free-space optical interconnect based on arrays of vertical-cavity lasers and detectors with monolithic microlenses." Applied Optics 37.14 (1998): 2811-2821.

Sutton et al., "Intrinsic optimization using stochastic nanomagnets." Scientific Reports 7.1 (2017): 1-9.

Tiunov et al., "Annealing by simulating the coherent Ising machine." Optics Express 27.7 (2019): 10288-10295.

Vinci et al., "Hearing the shape of the Ising model with a programmable superconducting-flux annealer." Scientific Reports 4 (2014): 5703. 7 pages.

Wang et al., "Late Breaking Results: New Computational Results and Hardware Prototypes for Oscillator-based Ising Machines." Proceedings of the 56th Annual Design Automation Conference 2019. 2019. 2 pages.

Wang et al., "Oscillator-based ising machine." arXiv preprint arXiv: 1709.08102 (2017). 10 pages.

Wang et al., "PHLOGON: Phase-based logic using oscillatory nano-systems." International Conference on Unconventional Computation and Natural Computation Springer, Cham, 2014. 15 pages.

Yamaoka et al., "A 20k-spin Ising chip to solve combinatorial optimization problems with CMOS annealing." IEEE Journal of Solid-State Circuits 51.1 (2015): 303-309.

(56) References Cited

OTHER PUBLICATIONS

Yoshimura et al., "Uncertain behaviours of integrated circuits improve computational performance." Scientific Reports 5 (2015): 16213. 12 pages.

Zeng et al., "High data rate multiple input multiple output (MIMO) optical wireless communications using white LED lighting." IEEE Journal on Selected Areas in Communications 27.9 (2009): 1654-1662.

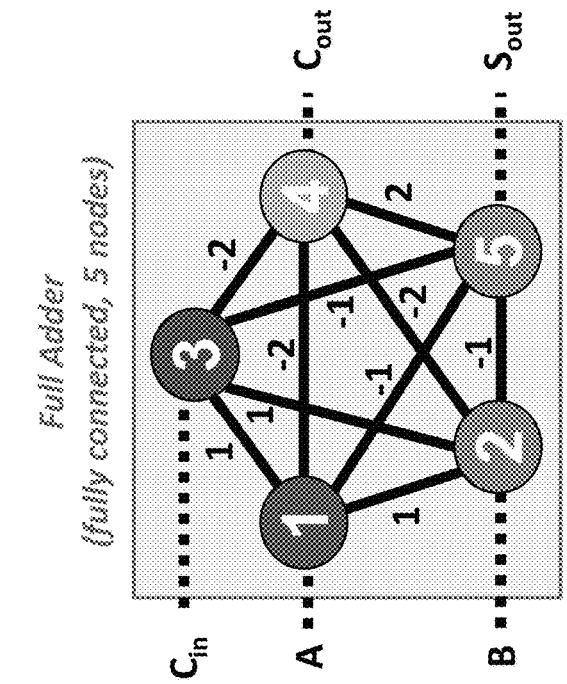
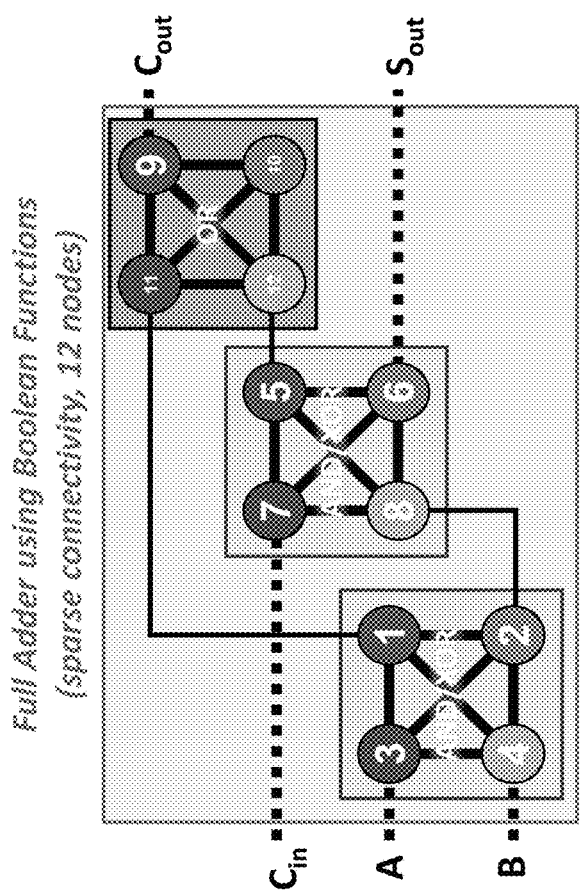
FIG. 8B
FIG. 8A

ALL ELECTRICAL FULLY CONNECTED COUPLED OSCILLATOR ISING MACHINE

CROSS-REFERENCE TO RELATED APPLICATIONS

This application claims the priority benefit, under 35 U.S.C. 119(e), of U.S. Application No. 62/928,110, filed on Oct. 30, 2019, the entire disclosure of which is incorporated herein by reference.

GOVERNMENT SUPPORT

This invention was made with Government support under Grant No. FA8702-15-D-0001 awarded by the U.S. Air Force. The Government has certain rights in the invention.

BACKGROUND

The Ising model is a useful computational tool that can be used to solve a variety of difficult computational problems. These problems can typically be represented by a graph G (V, E), where V represents the number of vertices (nodes) and E represents the number of edges. The model relies on finding a solution state s that minimizes the following Hamiltonian:

$$H = -\sum_{i,j}^{V} J_{ij} s_i s_j - \sum_{i}^{V} h_i s_i$$

where $J_{ij}$ represents the weight values interconnecting the nodes and $s=[s_i \ldots s_V]$ represents the solution space where $s_i$ can take the value of either +1 (spin ↑) or −1 (spin ↓).

The Ising model can be mapped to a variety of combinatorial optimization (CO) problems, which have proven to be notoriously difficult to solve using standard von Neumann computing architectures. Canonical examples of CO problem include the traveling salesman and MAX-CUT problems, for which exact methods scale very poorly with problem size. Applications of CO problems span many disciplines, including business operations, scheduling, traffic routing, finance, big data, drug discovery, machine learning, and many other systems involving the minimization of a complex energy landscape with multivariate inputs. Typical digital computing methods used to solve these problems rely on advanced sampling techniques such as simulated annealing and parallel tempering.

The Ising model dates back many decades but was re-popularized recently in an attempt to exploit quantum mechanical phenomena to speed up these computations. While quantum annealing machines continue to make progress, a variety of classical approaches using digital complementary metal-oxide-semiconductor (CMOS) annealing architectures, memristor cross-bar arrays, and graphics processor unit (GPU)-based methods have proven competitive in solving CO problems without relying on exotic and difficult-to-control quantum hardware.

Recently, a computing architecture utilizing coupled optical parametric oscillators has been used to solve CO problems. Solving CO problems with coupled optical parametric oscillators could be significantly faster than solving CO problems with conventional digital computing techniques and quantum annealers at large numbers of node. Coupled nonlinear dynamical systems represent a fundamentally new paradigm for computing which could offer significant advantages over conventional computing architectures. Solving CO problems with networks of coupled optical parametric oscillators emulated on conventional hardware can surpass the performance of state-of-the-art techniques, motivating the desire to build networks of coupled optical parametric oscillators in physical hardware.

SUMMARY

An all-electronic coupled oscillator network is mathematically similar to the coupled optical parametric oscillator network and can be realized using readily available electronic components interconnected in parallel. In this case, the underlying oscillator technology relies on standard LC (inductor-capacitor) electronic oscillators instead of optical parametric oscillators. The use of conventional electronic hardware provides an enormous economic and scaling advantage, allowing for chip-scale integration using existing semiconductor technology and providing an attractive area for further study.

We built upon and demonstrated a four-node, fully connected LC oscillator-based analog circuit with standard electronic components which accurately maps to the Ising model. This new circuit architecture can be used to program variable interconnection strengths for solving many real-world CO problems. This work is disclosed in U.S. application Ser. No. 16/832,056, filed on Mar. 27, 2020 and entitled "All-to-All Connected Oscillator Networks for Solving Combinatorial Optimization Problems," which is incorporated herein by reference.

We have since developed other architectures for coupled electronic oscillators. For example, a new architecture may include a network of oscillators (e.g., electronic ring oscillators in an integrated circuit), at least one reference oscillator, and a latching circuit. Each oscillator in the network of oscillators is differentially coupled to each other oscillator in the network of oscillators and emits an oscillatory waveform. The reference oscillator is unidirectionally coupled to each oscillator in the network of oscillators and emits a reference waveform to each oscillator in the network of oscillators. And the latching circuit is coupled to the network of oscillators and the reference oscillator. In operation, it generates a bit stream representing phases of the oscillatory waveforms with respect to the reference waveform.

The network of oscillators can be configured to solve the Hamiltonian:

$$H = -\sum_{i,j}^{V} J_{ij} s_i s_j - \sum_{i}^{V} h_i s_i$$

where V is the number of oscillators in the network of oscillators, $J_{ij}$ represents a weight of a link interconnecting the $i^{th}$ and $j^{th}$ oscillators in the network of oscillators, $s_i$ represents a relative phase of the $i^{th}$ oscillator in the network of oscillators and can take a value of either +1 or −1, $h_i$ represents a weight of a link connecting the reference oscillator to the $i^{th}$ of oscillator in the network of oscillators, and i and j are integers from 1 to V.

Such a system can be configured to operate as a Viterbi decoder, where each oscillator in the network of oscillators represents a node in a trellis of the Viterbi decoder. The oscillators that are in-phase represents respective correct message bits and interconnected logical oscillators that are out-of-phase represent respective incorrect message bits. The system can be configured so that only one oscillator per column is in-phase.

The network of oscillators can also comprise oscillators configured to perform at least one Boolean logic operation, such as NOT, OR, XOR, or AND. The resulting Boolean logic gates can be concatenated to form a full or half adder and/or to multiply and factor numbers.

The reference waveform may be a square wave or turned into a square wave, with the latching circuitry configured to latch the oscillatory waveforms between edges of the square wave.

The system may also include a polarity switch, operably coupled between a pair of oscillators in the network of oscillators, to switch a polarity of a connection between the pair oscillators. There may be a processor, operably coupled to the polarity switch, to actuate the polarity switch and to control a weight of the connection between the pair of oscillators.

A Viterbi decoder can be implemented as interconnected logical oscillators arranged in a trellis having M columns of N interconnected logical oscillators, where M and N are positive integers greater than 1 and the interconnected logical oscillators can be emulated in a classical processor or implemented as electronic interconnected logical oscillators (e.g., ring oscillators). Each of these interconnected logical oscillators represents a corresponding node of the trellis. Interconnected logical oscillators that are in-phase represent respective correct message bits and interconnected logical oscillators that are out of phase represent respective incorrect message bits. Each of the interconnected logical oscillators has a 1/N chance of representing a correct message bit. Connections among the interconnected logical oscillators are weighted based on a distance metric (e.g., Hamming distance) defined in the Viterbi decoder.

The Viterbi decoder may also include ancillary oscillators coupled to the interconnected logical oscillators. In each of column of the trellis, each of the interconnected logical oscillators may be connected to each other logical oscillator in the trellis, to at least one of the ancillary oscillators, and to two logical oscillators in an adjacent column of the trellis.

A Boolean logic gate can also be implemented as a network of electronic oscillators. Each electronic oscillator in the network of electronic oscillators is differentially coupled to each other electronic oscillator in the network of electronic oscillators with a weight selected to cause the network of electronic oscillators to perform a Boolean logic operation (e.g., a NOT, OR, AND, or XOR operation). For instance, the Boolean logic operation can be an AND operation performed on a first input at a first electronic oscillator in the network of electronic oscillators and a second input at a second electronic oscillator in the network of electronic oscillators to yield an output at a third electronic oscillator in the network of electronic oscillators. The network of electronic oscillators can be further configured to factor a number input at a third electronic oscillator into factors output at the first electronic oscillator and the second electronic oscillator.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 8A shows a sparsely connected, twelve-node oscillator network configured to form two AND/XOR gates and an OR gate connected to act as a full adder.

FIG. 8B shows a fully connected, five-node oscillator network configured to act as a full adder.

DETAILED DESCRIPTION

Simulated or physical networks of coupled electronic oscillators can be used to implement an Ising machine. Such a network can be made of suitable electronic oscillators, such as LC oscillators, that are coupled together differentially instead of with direct resistive coupling. For example, the electronic oscillators in the network may be coupled to each other with a cross-bar array of tunable resistors, where each tunable resistor is set to a value corresponding to an entry in the coupling matrix $J_{ij}$ of the Ising model. Op-amp buffer circuits isolate the impedance of the interconnects from the oscillators. Isoating the oscillators from the interconnect impedance enables large scaling of the number of oscillators in the network as each oscillator is isolated from the scale of the system. If desired, one or more reference oscillators can be unidirectionally coupled to the networked oscillators via respective tunable resistors whose values correspond to the biases $h_1$ in the Ising model. The reference oscillators transmit, but don't receive, so their outputs bias or constrain the other oscillators, for example, so that only certain other oscillators can be in phase at a particular time.

Because electronic oscillators are compatible with microelectronics fabrication, they can be used for both large-scale server systems and edge devices. Potential applications include large-scale materials simulations, drug discovery, vehicle routing, chemical structure analysis, financial portfolio optimization, satellite scheduling, general logistics optimization, accelerated deep learning, neural network training, unsupervised machine learning, robotics control, and processor allocation in central processor unit (CPU) systems. Coupled oscillator systems may also unlock computing problems previously deemed untenable with other approaches, including in communications and (semi-)prime factoring.

Coupled Oscillator Networks for Viterbi Decoding

A coupled oscillator network can be used to implement the Viterbi algorithm. The Viterbi algorithm is an error correction scheme used in many modern digital communication links. This error correction scheme relies on the addition of parity bits to a particular message which can, upon transmission, be intelligently used at a receiver to determine the original transmitted bit string in the presence of noise. The decoding process is an example of dynamic programming, where distance metrics are calculated between a set of received bits and the potential combinations of bits that could have been received. Based on the particular encoding scheme used, a trellis diagram can be used to map out the likelihood of each possible bit stream. The shortest path along the trellis is calculated dynamically to estimate the highest likelihood bit stream which was sent from the transmitter. The Viterbi decoder is a common technique and is widely understood within the engineering community.

Figure 1:
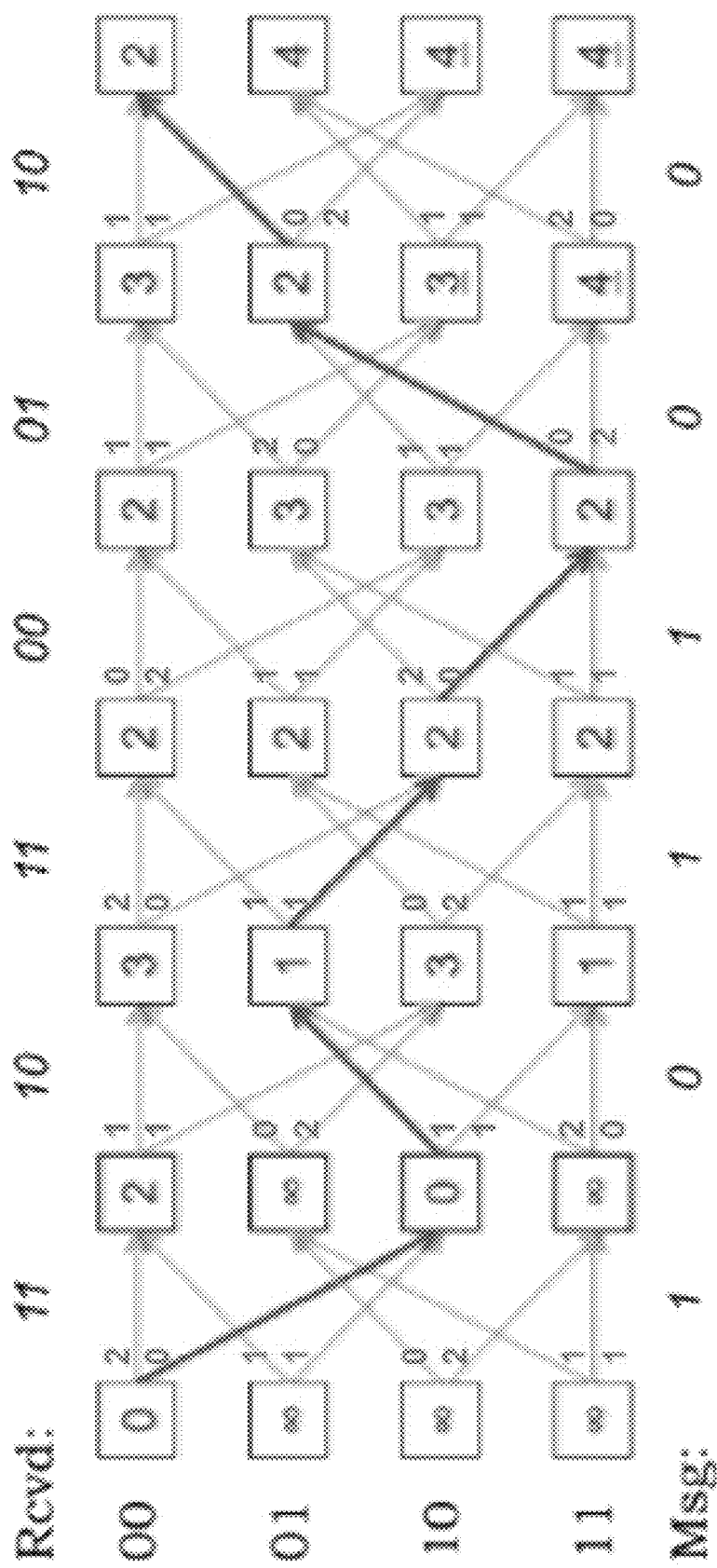
FIG. 1 shows an example trellis diagram for implementing Viterbi decoding.

FIG. 1 shows an example trellis diagram for implementing Viterbi decoding. Each column of the trellis has the set of states. Each state in a column is connected to two states in the next column. The top link from each state in a column of the trellis shows what gets transmitted on a 0, while the bottom link shows what gets transmitted on a 1. In FIG. 1, the links between states that are traversed in the trellis given the message 101100. A Viterbi decoder find a maximum likelihood path through the trellis for a received sequence of parity bits—that is, the sequence of states in the trellis that can explain the observed, and possibly corrupted, sequence of received parity bits.

The coupled oscillator system represents a new way to approach Viterbi decoding. In this framework, this trellis diagram can be represented by a set of coupled oscillators. Each node in the trellis represents an oscillator in the coupled oscillator system, which may be simulated or implemented in hardware. In order to enforce the condition that only one node (bit combination) be occupied (received) at each time step, a set of ancillary nodes are used at each time step. For example, in the scenario depicted in FIG. 1, each column of four logical oscillators would have at least one ancillary oscillator and up to an additional four ancillary oscillators, for up to one ancillary oscillator per logical oscillator. The connection weights J and biases h among the oscillators are adjusted such that, if each column in the trellis was observed as an isolated system, the lowest energy condition would be represented by the situation where only one logical oscillator out of the four logical oscillators would be in-phase, while the other three logical oscillators would be out-of-phase. Each logical oscillator in the column would have an equal chance of being in-phase, which would indicate the correct message bit which was passed through the channel.

Figure 2:
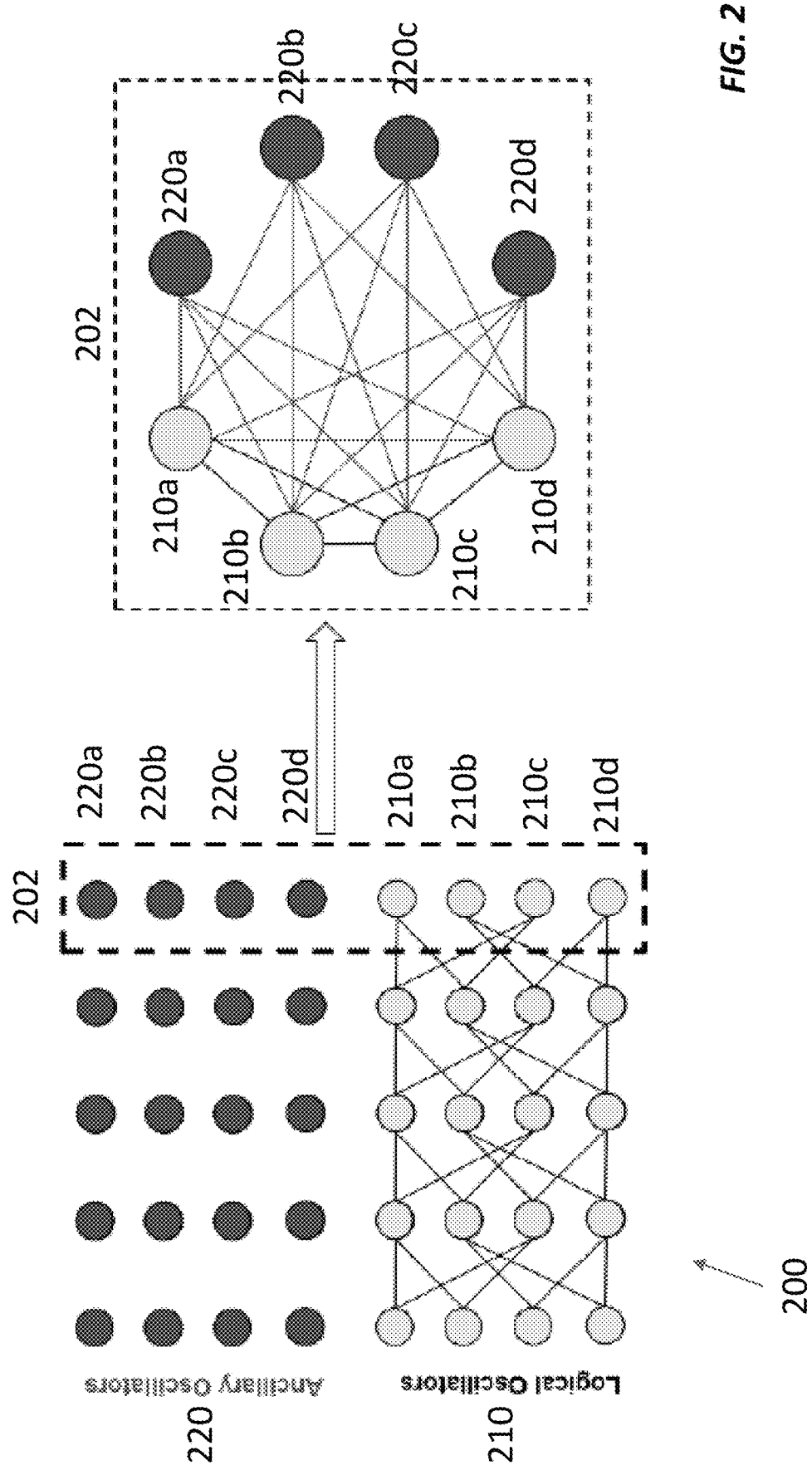
FIG. 2 shows a coupled oscillator network mapped to the Viterbi trellis shown in FIG. 1.

FIG. 2 shows an example mapping of the trellis from FIG. 1 onto a network 200 of coupled oscillators (left). This network 200 includes both logical oscillators 210 and ancillary oscillators 220 arranged in five columns of four logical oscillators 210 and four ancillary oscillators 220 per column. The trellis may have more or fewer rows or columns, with at least one ancillary oscillator 220 per column and up to one ancillary oscillator 220 per logical oscillator. The logical oscillators 210 are connected to each other as shown at left in FIG. 2, with each logical oscillator 210 connected to two logical oscillators 210 in the adjacent row(s), where upper links (connections) represent what gets transmitted on a 0 and bottom links (connections) representing what gets transmitted on a 1.

FIG. 2 shows the connections among the logical oscillators 210a-210d and ancillary oscillators 220a-220d in the right-most column 202 of the trellis (right). Each logical oscillator 210a-210d is connected to each other logical oscillator 210a-210d in the column and to each ancillary oscillator 220a-220d in the column 202. The ancillary oscillators 220a-220d in the column 202 are not connected to each other.

As noted above and shown in FIG. 2, each node (logical oscillator 210) in each column is connected to only two other nodes (logical oscillators 210) in the neighboring column(s). This reduces the connectivity requirements of the coupled oscillator system 200. The connection weight values (J) between the columns in the trellis 200 depend on the distance metric (e.g., the Hamming distance) defined in the Viterbi decoder, or the number of bits that differ between the received bit sequence and the expected bit sequence. In the example shown in FIG. 2 (a 2-bit example), the distances can take values of 0, 1, and 2. Similarly, each connection strength J takes on one of three discrete values, with the smallest distance corresponding to the strongest negative connection strength. When the connection strengths J and bias values h are programmed appropriately, the coupled oscillator system 200 can be simulated using a conventional processor. Starting from random initial conditions, the nodes (logical oscillators 210) that settle in-phase represent the lowest energy state, or shortest path travelled through the trellis. The ancillary oscillators 220 enforce the condition that only one node per column in the trellis settles to an in-phase state.

Figures 3A, 3B:
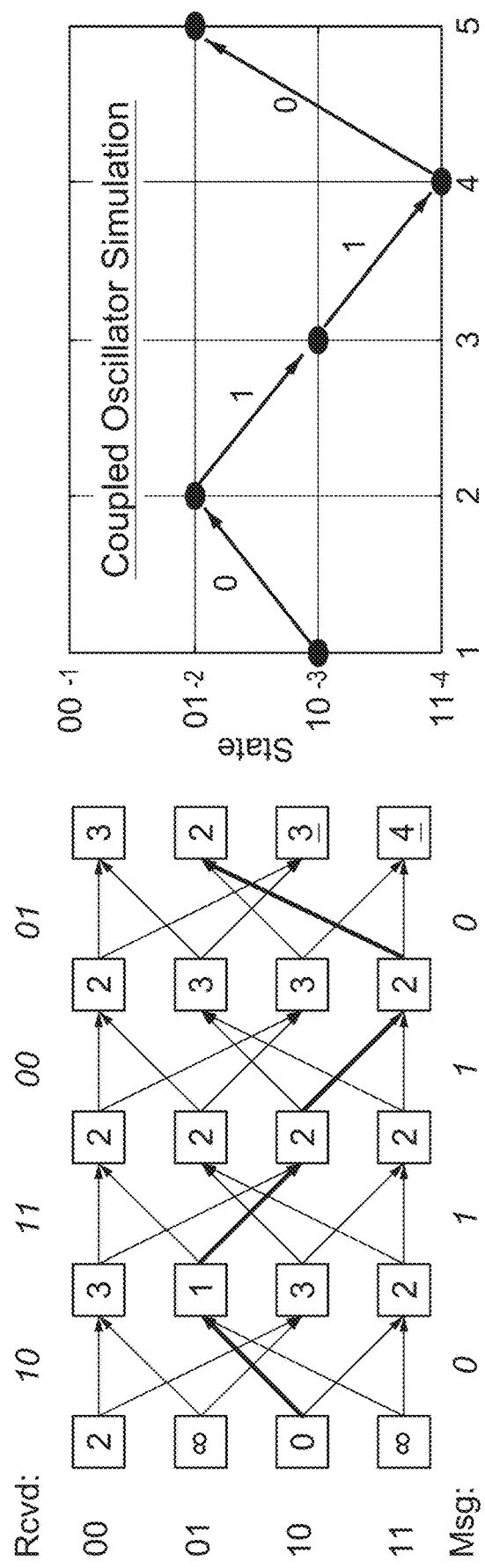
FIG. 3A shows the distance metrics and shortest path through the trellis of FIG. 1 as calculated with a standard Viterbi decoder.
FIG. 3B illustrates the trellis of FIG. 1 translated onto the coupled oscillator configuration of FIG. 2 and simulated using the forward Euler's method.

FIGS. 3A and 3B show a simulated section of the example shown in FIG. 1. FIG. 3A shows the distance metrics as would be calculated with a standard Viterbi decoder, and the corresponding shortest path (i.e., the path with smallest sum of distance metrics). FIG. 3B shows the same system translated onto a coupled oscillator configuration like the one in FIG. 2 and simulated using the forward Euler's method. The dots in FIG. 3B indicate oscillators that settle to in-phase solutions, and the up and down links between the in-phase oscillators represent the bits in the message. In FIG. 3B, the bits are 0110 for the maximum likelihood message.

The benefits of using the coupled oscillator system for Viterbi decoding stem from the fact that no information needs to pass between logic computational blocks and memory in order for the system to find an answer. This is a standard bottleneck of digital computing systems and is completely eliminated in the coupled oscillator system. This bottleneck is missing from the coupled oscillator Viterbi decoder because all the information needed for the computation is included in the J matrix, which is encoded as the weights of the links among the logical oscillators, and the h matrix, which is encoded as the weights of the links from the ancillary oscillators to the logical oscillators. No iterative calculation is required. In contrast, standard dynamic programming involves checking a calculation as compared to one or many previous calculations.

Another major advantage is the scaling. The example shown in FIGS. 3A and 3B has a constraint length of C=3 and traceback length T=4. The number of possible states K is represented by $K=2^{(C-1)}$. In standard digital hardware, the number of processes required to decode this system scales as $O(K^2T)$ in time. For a coupled oscillator system, this scaling trends as $O(KT)$, making it feasible to perform Viterbi decoding with far fewer resources when the problem sizes grow large.

Prime Factorization

A coupled oscillator system can also be used to perform invertible Boolean operations, which are difficult for traditional digital computers to handle. Boolean logic gates can be mapped onto Ising spin glass systems, where the ground states of the Ising system represent the truth tables for the particular logic functions. One benefit of using these coupled oscillator systems to perform Boolean logic is that, besides running standard logical computations, the Boolean logic blocks can be operated in the reverse direction. Operating Boolean logic blocks in reverse is especially useful for factoring prime numbers.

FIGS. 4, 5A, 5B, 6A, 6B, 7A, and 7B show networks of two to four coupled oscillators programmed to operate as Boolean logic blocks. In each of these figures, the oscillators (nodes) are represented as circles numbered 1, 2, 3, and 4. The oscillators 1-4 are connected to each other by links, represented as dark lines labeled with numbers (e.g., −2, −1, 1, 2) representing the links' coupling strengths. The numbers in curly brackets {−1, 1} next to each node represent the possible states of that node, i.e., out-of-phase (−1) or in-phase (1). Each of these figures also includes a plot of energy versus state.

A full logic operation does not require all-to-all connectivity among the oscillators. In the four-node logical gates described below, for example, each logical gate is connected to one other gate at the output and two other gates at the input. The resulting string of connected gates can be represented by a collection of coupled oscillators, each in groups of two, three, four, or more. Each group of oscillators may be fully connected within itself but may be sparsely connected to adjoining groups of oscillators (neighboring gates).

Figure 4:
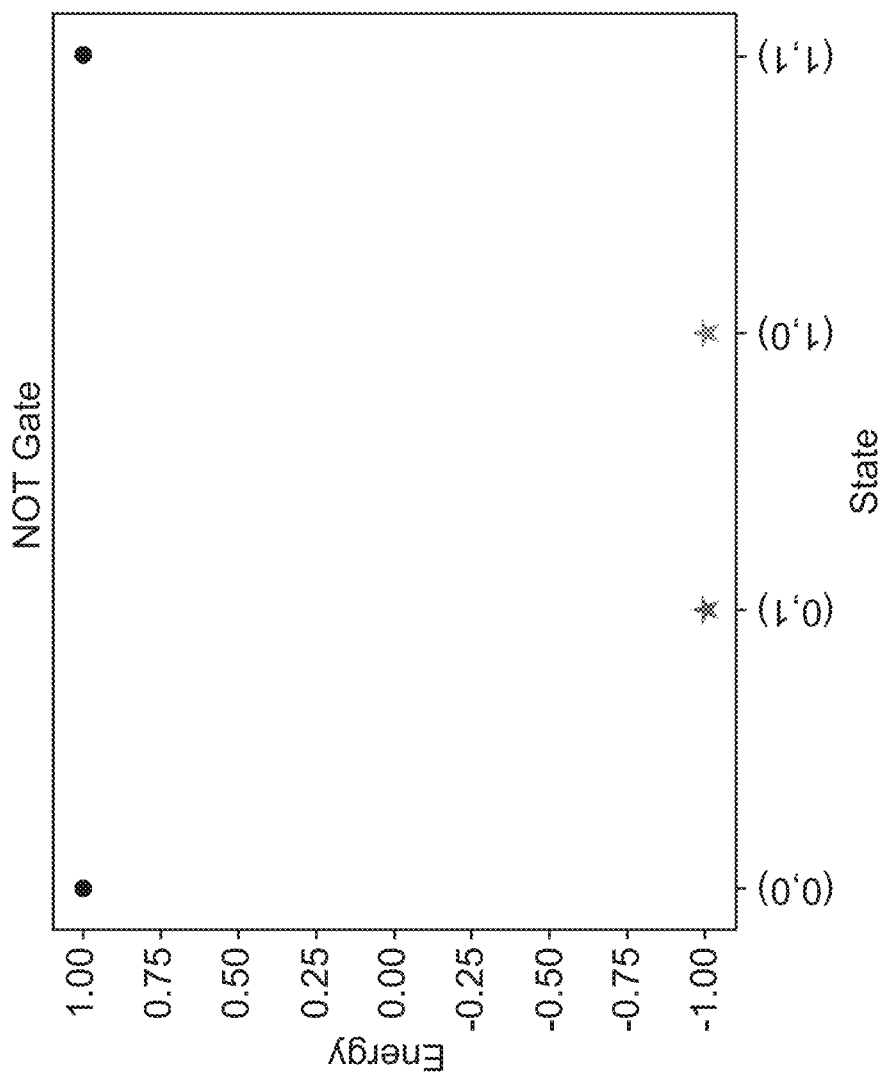
FIG. 4 shows a two-node oscillator network configured to act as an OR gate.
Figure 4:
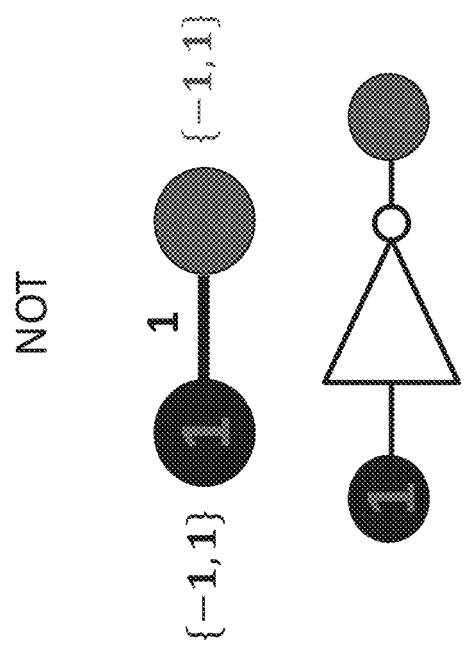

FIG. 4 shows a pair of oscillators configured to operate as a NOT gate. The oscillators are connected with a link of weight 1 and produce an output at oscillator 2 that is the inverted input to oscillator 1.

Figure 5A:
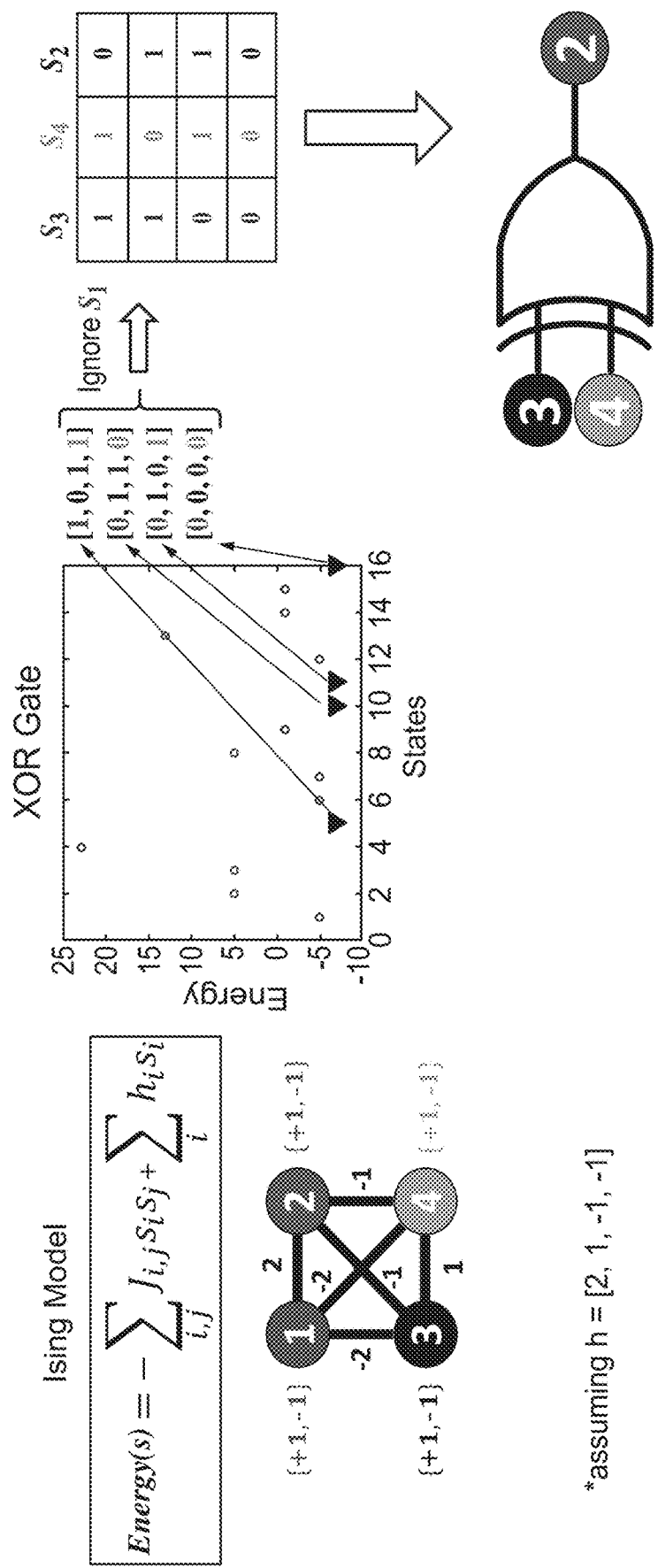
FIG. 5A shows a four-node oscillator network configured to act as an XOR gate.

FIG. 5A shows a four-node oscillator network configured to operate as an XOR gate, with inputs at oscillators 3 and 4 and an output at oscillator 2. The truth table at upper right shows the input states $s_3$ and $s_4$ and output states $s_2$. The output states correspond to the lowest energy configurations for the corresponding input states.

Figure 5B:
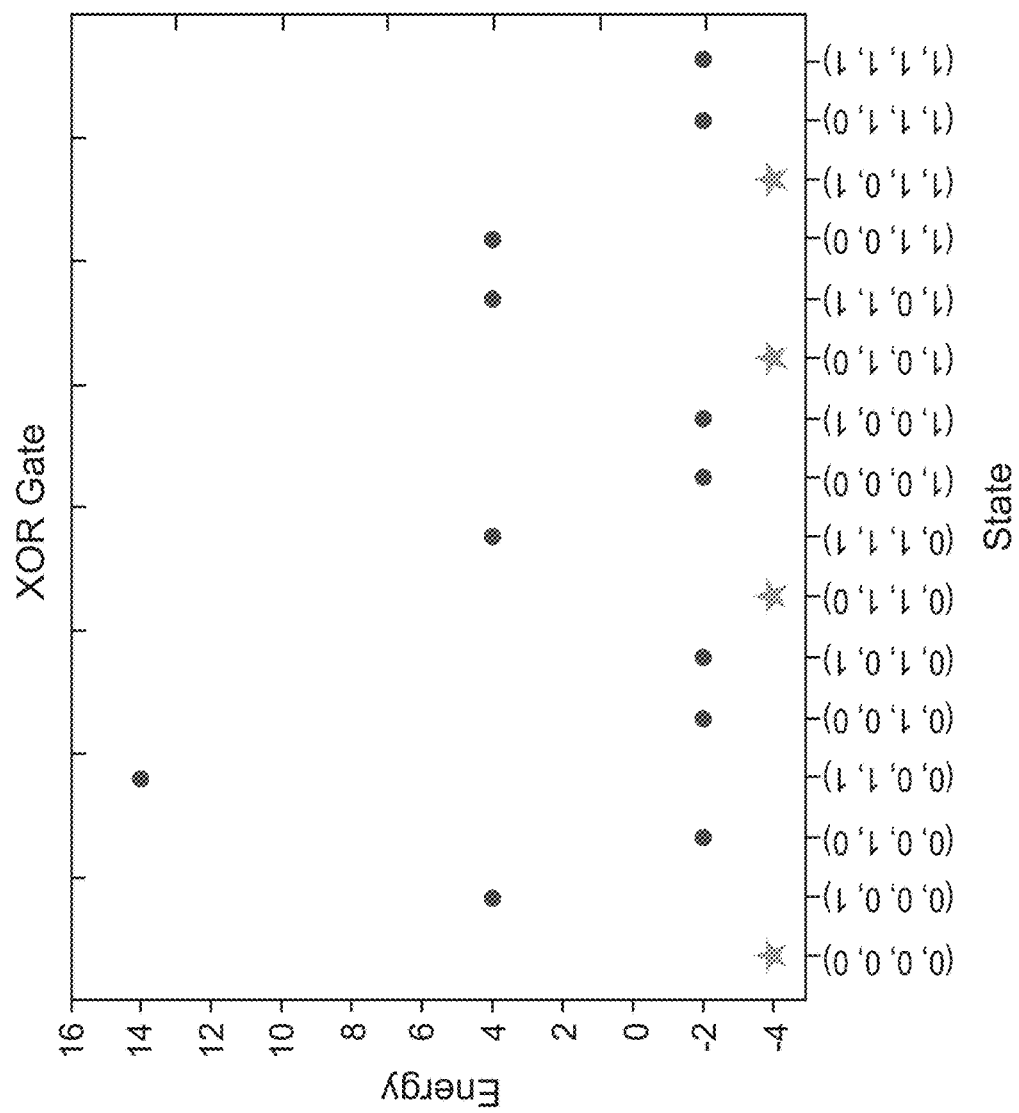
FIG. 5B shows an alternative four-node oscillator network configured to act as an XOR gate.
Figure 5B:
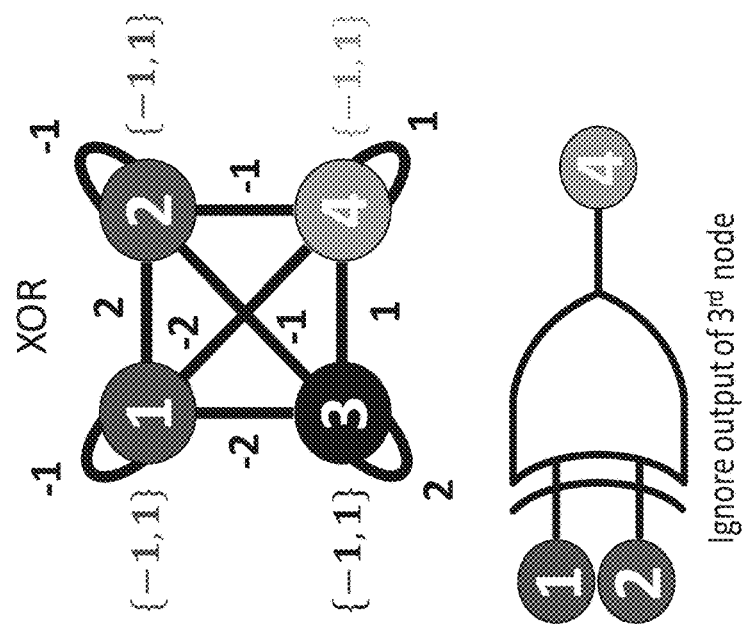

FIG. 5B shows an alternative four-node oscillator network configured to operate as an XOR gate, with inputs at oscillators 1 and 2 and an output at oscillator 4. In this case, each oscillator is coupled to itself as well as to the other three oscillators in the network.

Figure 6A:
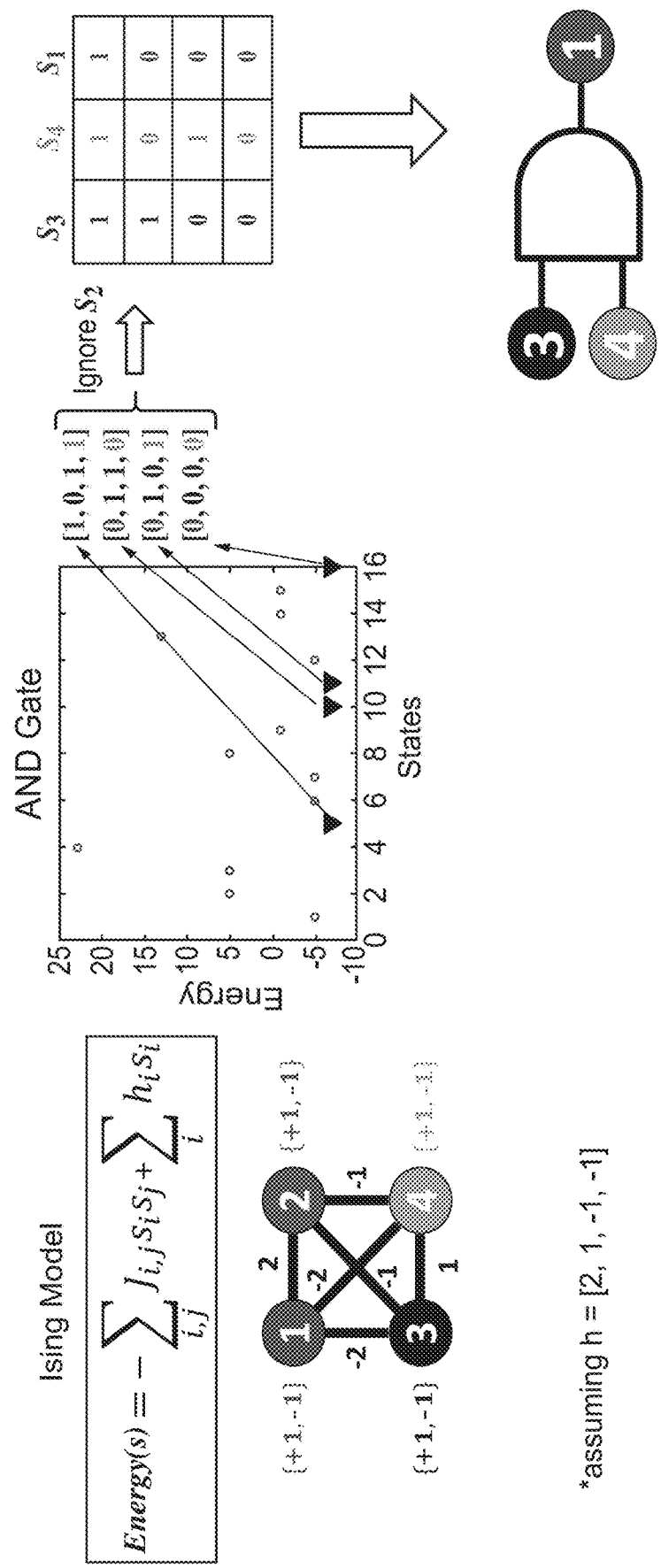
FIG. 6A shows a four-node oscillator network configured to act as an AND gate.

FIG. 6A shows a four-node oscillator network configured to operate as an AND gate, with inputs at oscillators 3 and 4 and an output at oscillator 1. This configuration is identical to the XOR gate in FIG. 5A—the nodes are connected in the same fashion, with the same link weights—except that the output is at oscillator 1 instead of oscillator 2. The truth table at upper right shows the input states $s_3$ and $s_4$ and output states $s_1$. The output states correspond to the lowest energy configurations for the corresponding input states.

Figure 6B:
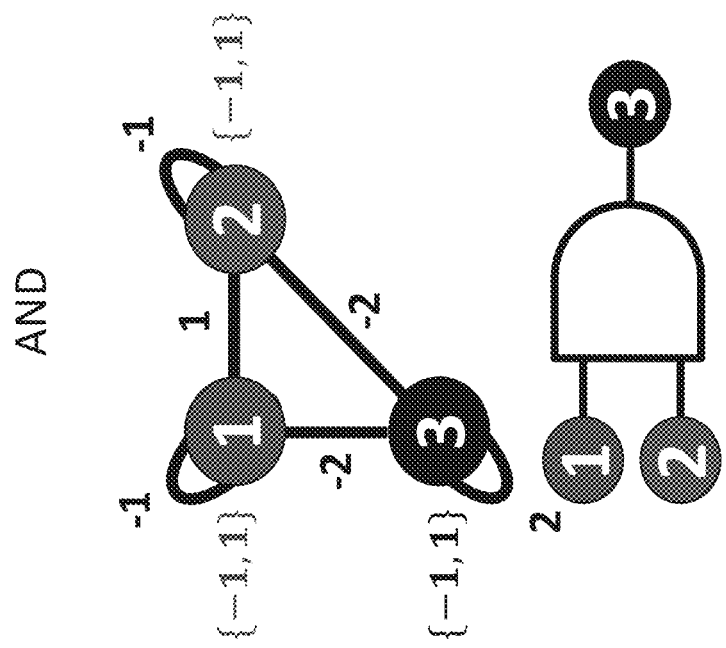
FIG. 6B shows a three-node oscillator network configured to act as an AND gate.
Figure 6B:
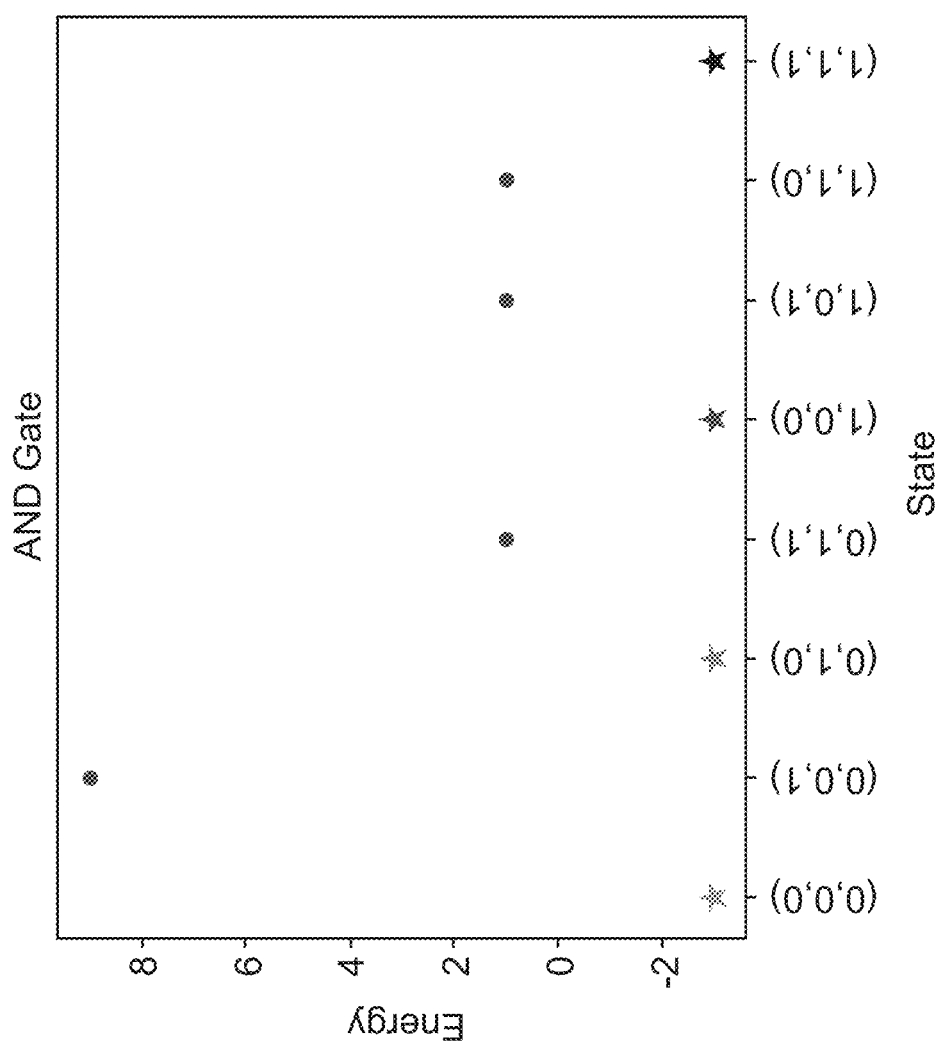

FIG. 6B shows an alternative three-node oscillator network configured to operate as an AND gate, with inputs at oscillators 1 and 2 and an output at oscillator 3. In this case, each oscillator is coupled to itself as well as to the other two oscillators in the network.

Figure 7A:
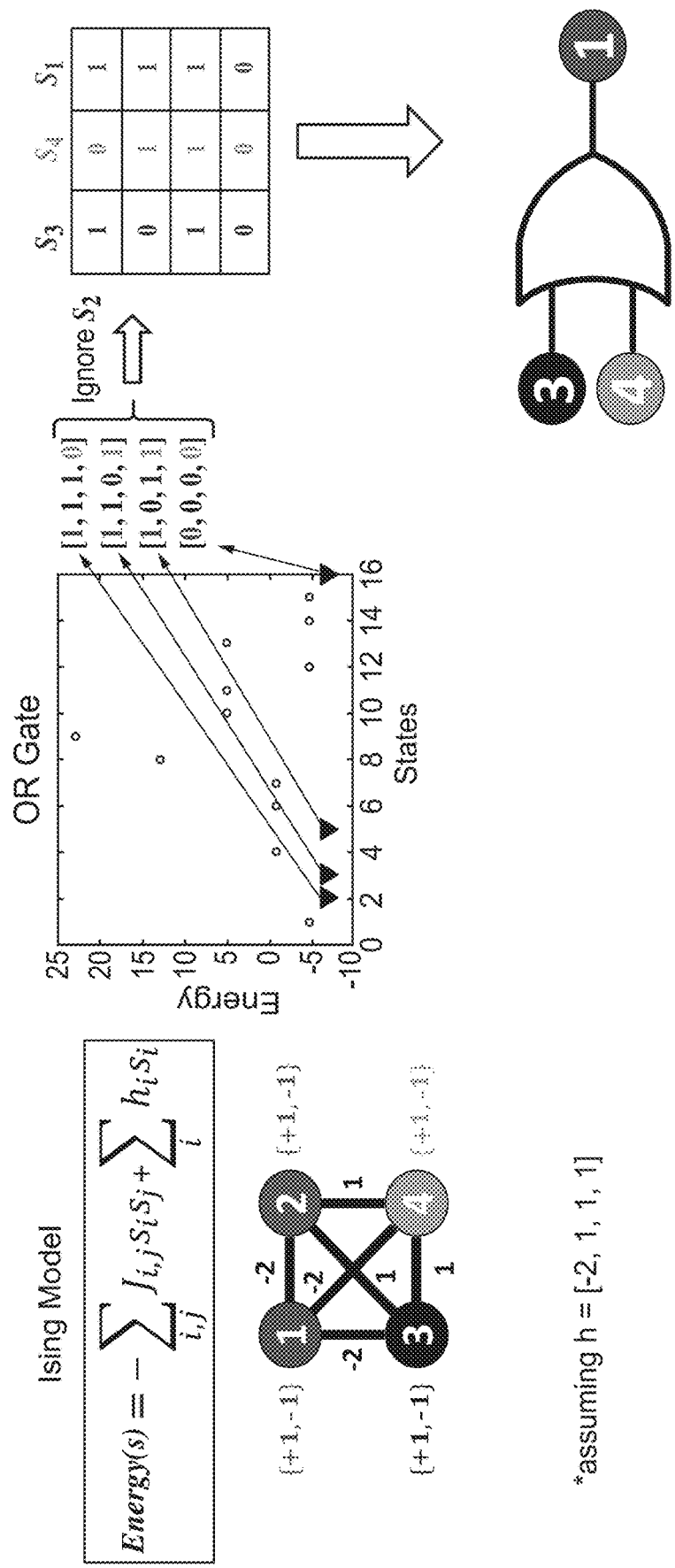
FIG. 7A shows a four-node oscillator network configured to act as an OR gate.

FIG. 7A shows a four-node oscillator network configured to operate as an OR gate, with inputs at oscillators 3 and 4 and an output at oscillator 1. The truth table at upper right shows the input states $s_3$ and $s_4$ and output states $s_1$. Again, the output states correspond to the lowest energy configurations for the corresponding input states.

Figure 7B:
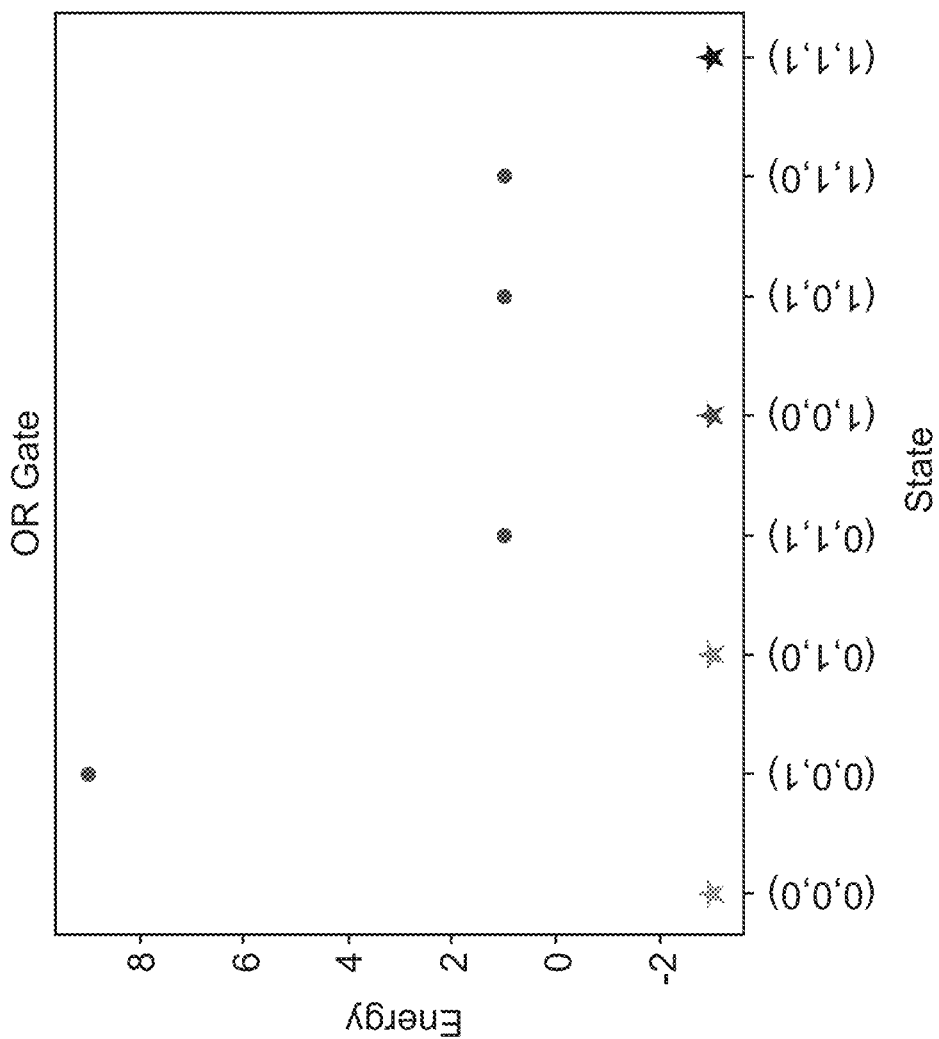
FIG. 7B shows a four-node oscillator network configured to act as an OR gate.
Figure 7B:
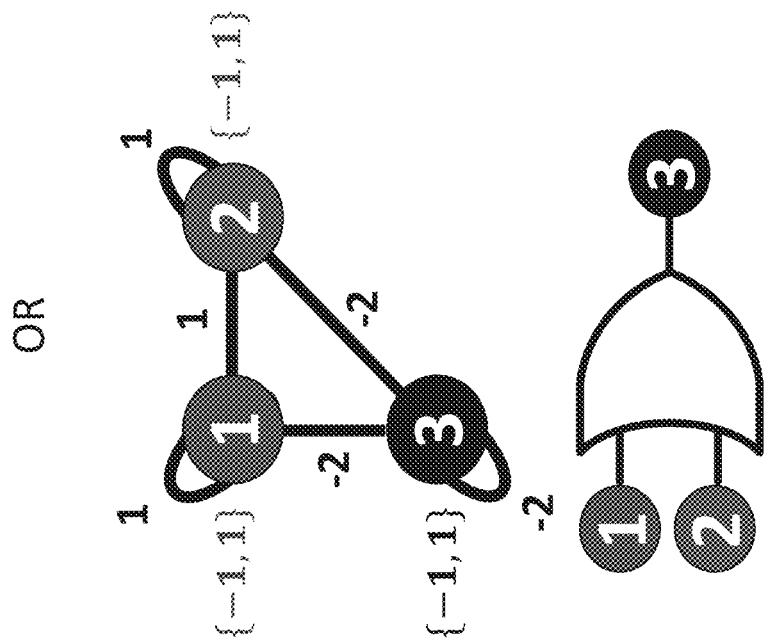

FIG. 7B shows a three-node oscillator network configured to operate as an OR gate, with inputs at oscillators 1 and 2 and an output at oscillator 3. Each oscillator is coupled to itself as well as to the other two oscillators in the network. The link weights are the same as for the three-node AND gate in FIG. 6B, except that the polarities of the self-coupling are flipped.

Boolean logic blocks can be combined to perform higher-level binary arithmetic operations such as addition. FIG. 8A shows an example of combining two AND/XOR four-node oscillator networks with an OR four-node oscillator network to create a one-bit full adder using 12 oscillators and relatively sparse connectivity among the 12 oscillators. Alternatively, FIG. 8B shows a one-bit full adder formed of a fully connected network of five oscillators.

Figure 9:
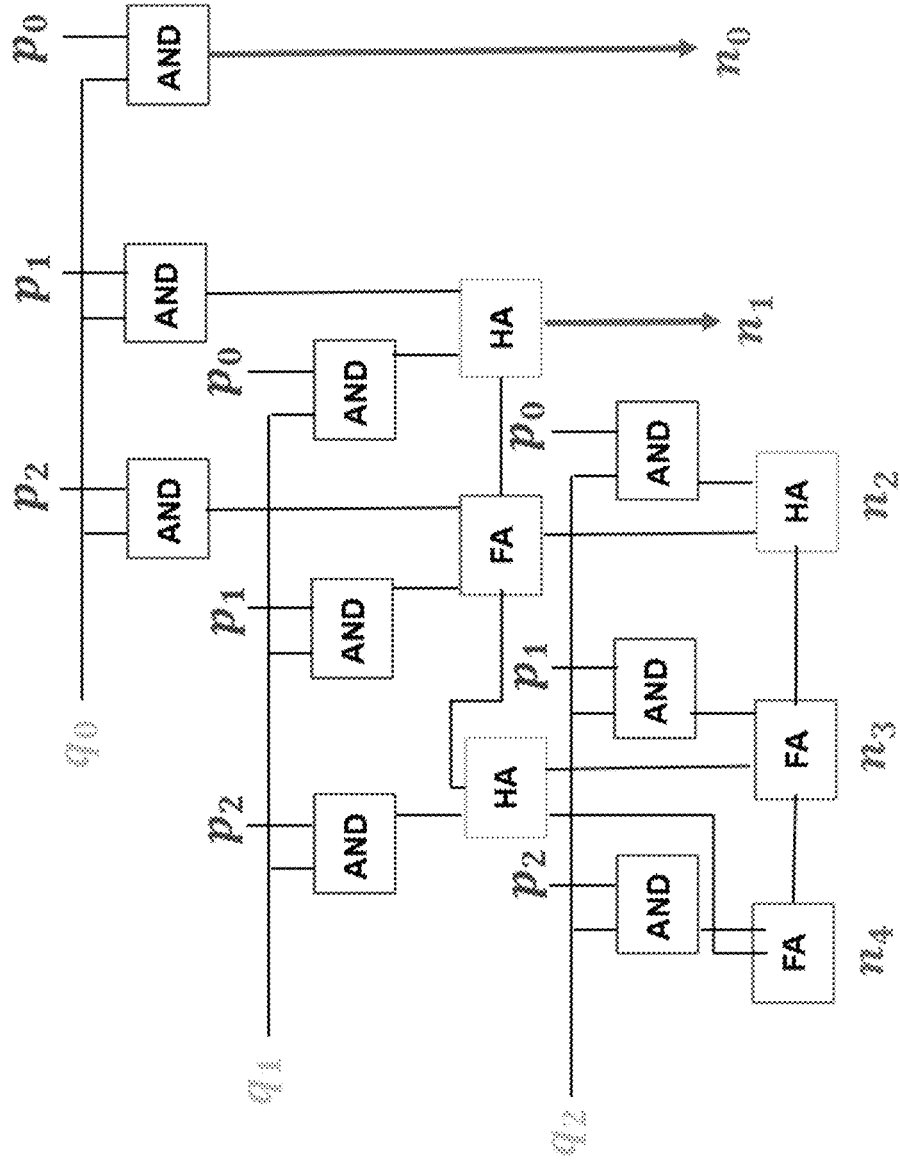
FIG. 9 shows AND gates, full adders (FAs), and half adders (HAs) connected for 3-bit multiplication or factorization.

FIG. 9 shows a multiplication circuit that can perform multiplication and semiprime factorization constructed using AND, half adder (HA), and full adder (FA) logical blocks. In this example, the circuit is constructed following a typical binary multiplication algorithm for multiplying a 3-bit (prime) number p by a 3-bit (prime) number q to yield a 5-bit number n. A multiplier circuit can be operated in the forward direction, where two binary number inputs p and q are multiplied together to yield the result n (e.g., 3×5=15).

The multiplication circuit in FIG. 9A can also operate in the reverse direction, e.g., to factor a 5-bit number into a pair of 3-bit numbers. More specifically, the ground state of the Ising machine (the oscillator network(s) forming the multiplication circuit) can identify which numbers produce a particular product (e.g., n=15 yields (p, q)=(3, 5) or (5, 3)).

Figure 10A:
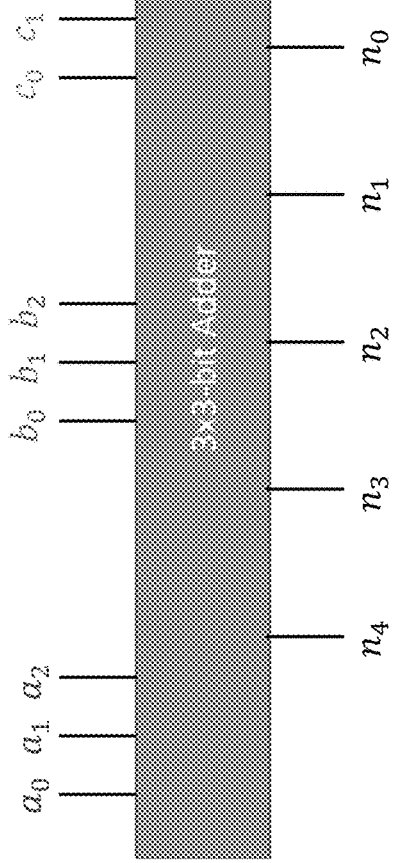
FIG. 10A shows a 3×3 bit compact adder.
Figure 10B:
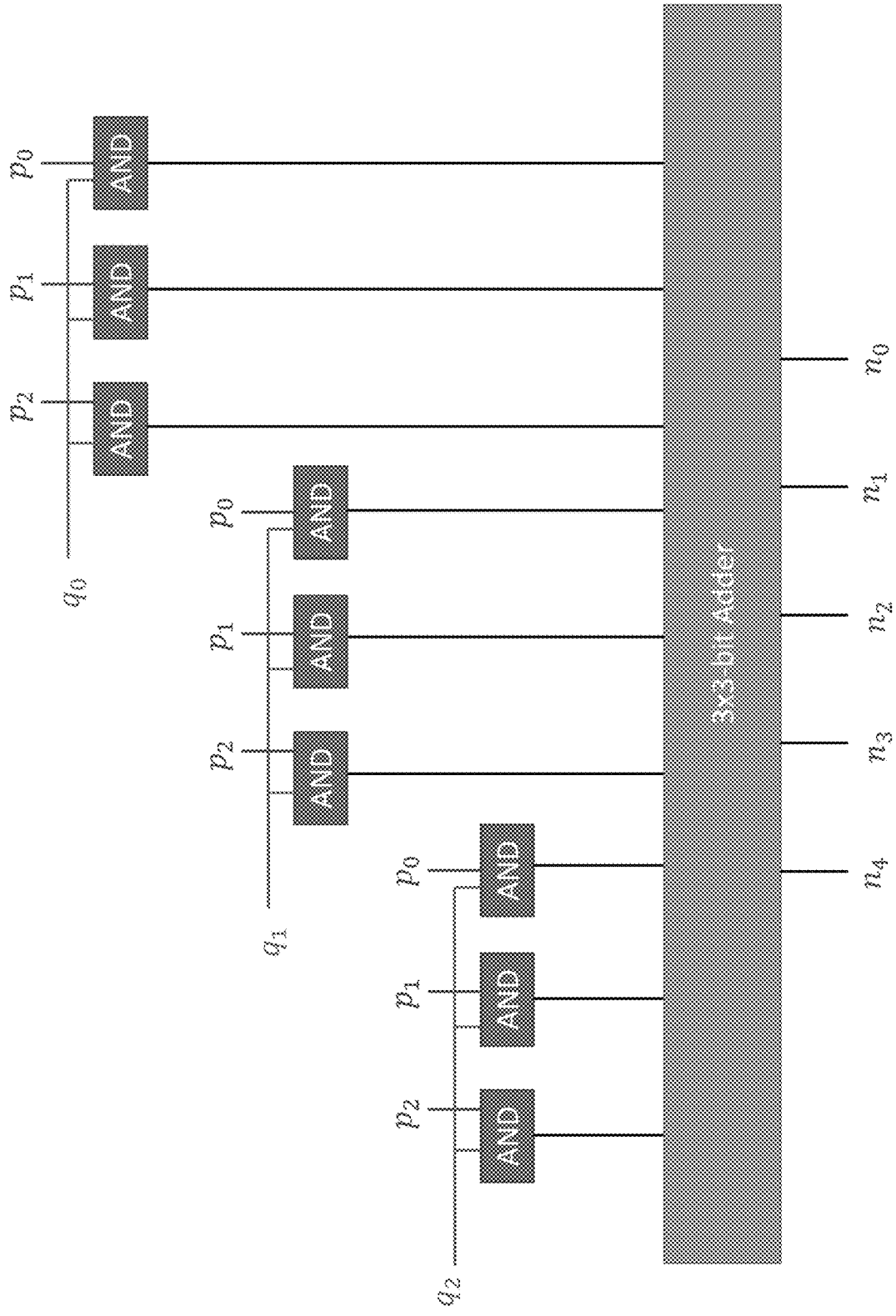
FIG. 10B shows a 3-bit compact multiplier/semi-prime factorization circuit formed of a 3×3 bit adder coupled to nine AND gates.

FIGS. 10A and 10B show a compact adder and a compact multiplier/semi-prime factorization circuit constructed from the compact adder and several AND gates, respectively. The compact adder takes in three 3-bit numbers and returns their 5-bit sum. Similarly, the compact multiplier/semi-prime factorization circuit FIG. 10A shows a maximally compact representation of the compact adder, which is formed of a network of coupled oscillators (not shown). This network includes fourteen oscillators that are connected to each other in an all-to-all fashion according to the coupling matrix J, where each entry in the coupling matrix J represents the weight of the connection between a corresponding pair of these fourteen oscillators. The vector h represents coupling weights from a fifteenth oscillator to the fourteen interconnected oscillators. This fifteenth oscillator acts as a reference oscillator and broadcasts a phase reference signal to the fourteen interconnected oscillators. The reference oscillator does not receive inputs from the other oscillators. It may be connected to the other oscillators using the circuit shown in FIG. 13 and described below and can be used to latch the other oscillators phases as described below with respect to FIGS. 14A and 14B. The right-most vector in FIG. 10A represents the states (relative phases of the fourteen interconnected oscillators) at the inputs and outputs to the compact adder.

Prime factorization is incredibly difficult to do using standard computational methods and is the basis for many major cryptographic protocols. Factoring with the multiplication circuits in FIGS. 9 and 10B may take more time than multiplication but can still be much faster than factoring using conventional techniques. In addition, the multiplication circuit may not factor numbers with same as fidelity as it multiplies them. However, the factors can be checked quickly, e.g., by multiplying them with the same multiplication circuit or another processor to see if the resulting product matches the number being factored. Even accounting for checking the factors, prime factorization with real or simulated coupled oscillator networks can be much faster than conventional factoring. This approach can be used for other factorization problems in addition to prime factorization.

A Crossbar Interconnect Circuit Implementation of a Coupled Oscillator Network

Figure 11:
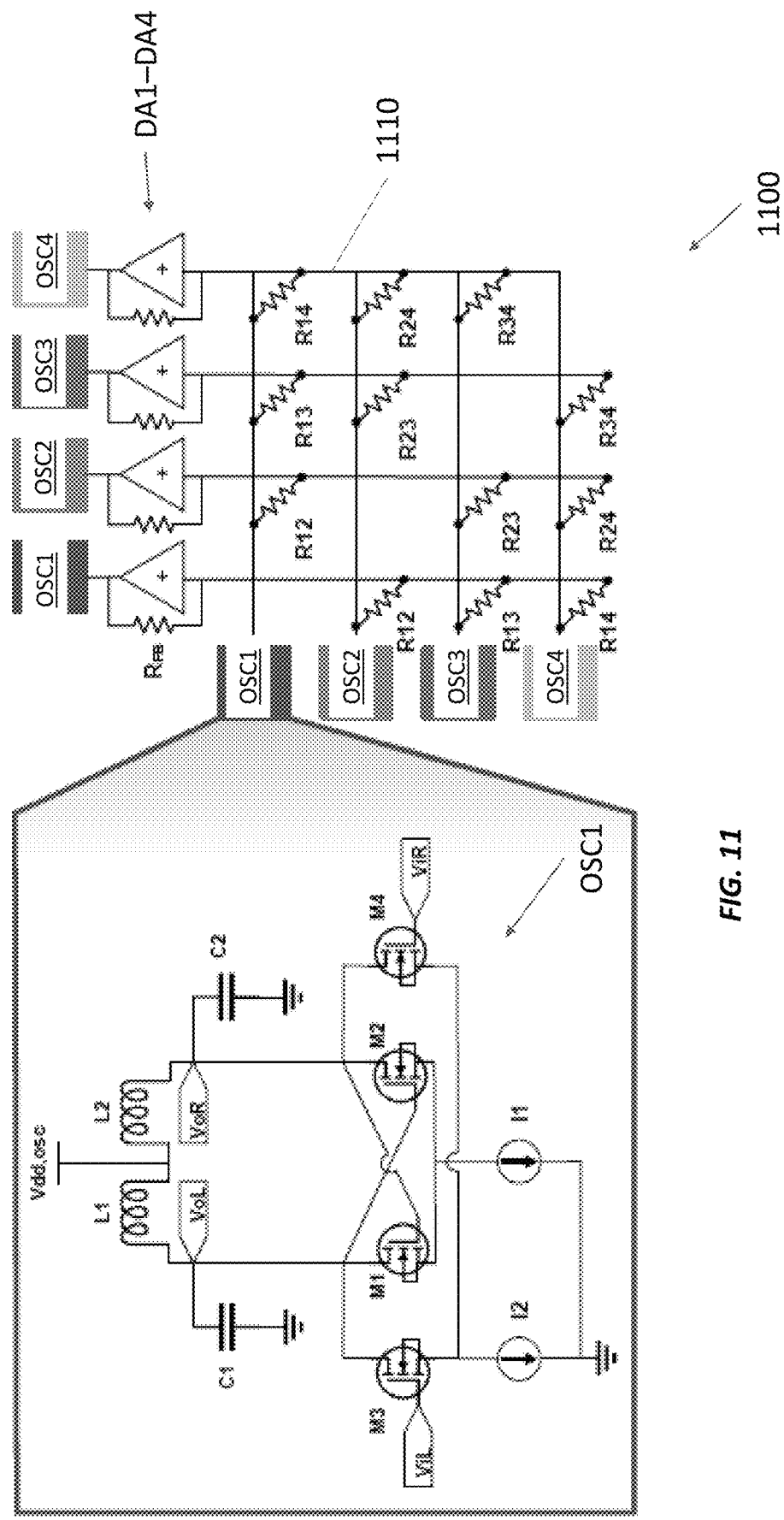
FIG. 11 shows a cross-bar interconnect architecture for connected oscillators.

FIG. 11 shows a crossbar array 1100 of fully connected LC oscillators OSC1-OSC4 coupled to each other using a differential coupling scheme. The crossbar array 1100 has an efficient, scalable architecture and so can easily be scaled to more or fewer oscillators. It can be scaled beyond four oscillators in a straightforward manner, which is a significant advantage. This crossbar array 1100 has a gain-ratio based coupling architecture with a network 1110 of tunable resistors R12-R34 that connect the oscillators OSC1-OSC4 to each other via a set of four amplifiers DA1-DA4. The tunable resistors R12-R34 can be implemented with digital potentiometers, resistive random access memory (RAM), memristors, or other tunable analog resistive devices.

The output signals from the oscillators OSC1-OSC4 are scaled by the summing amplifier gain shown in FIG. 11 and are determined by the ratio $G_{NM}=R_{FB}/R_{Nm}$, where $G_{NM}$ is the gain between oscillators N and M, $R_{FB}$ is resistance of the feedback resistor in parallel with each amplifier, and $R_{NM}$ is the resistance of the tunable resistor between oscillators N and M. For example, the signal going into oscillator OSC1 in FIG. 11 can be described with the equation $V_1=V_2G_{12}+V_3G_{13}+V_1G_{14}$, where $V_N$ represents the output signal (voltage) from oscillator N.

FIG. 11 also shows a circuit schematic (left) of oscillator OSC1. (The other oscillators OSC2-OSC4 may be implemented with the same circuit as oscillator OSC1.) This oscillator circuit OSC1 employs a differential injection-locked frequency divider topology. Transistors (e.g., Supertex TN0702) M1 and M2 form a cross-coupled pair, which serves as a negative resistance component for a unity loop gain. The coupling signal from the other oscillators OSC2-OSC4 is applied differentially through transistors M3 and M4.

The coupling circuitry shown in FIG. 11 is typically used for quadrature LC oscillators and employs an injection-locking based coupling scheme, which can be mapped to the generalized Adler's equation and to the Kuramoto model. Current source 12 provides the bias current for the coupling signal. The output voltage of the oscillator OSC1 is tapped at nodes VoL and VoR, directly out from the oscillating LC tank (e.g., L=100 µH, C=0.1 µF). The LC tank circuit is composed of inductor L1, capacitor C1, and inductor L2, capacitor C2 and may have a resonant frequency of 50 kHz. Current source I1 provides a biasing current for the oscillator circuit and can also be used for injection locking to help polarize the phases of the oscillator OSC1 to 0° and 180°.

One difference between a resistive coupling scheme and the differential coupling scheme in FIG. 11 is how the coupling signals are coupled to each oscillator OSC1-OSC4. In the resistive coupling scheme, current is injected only when a voltage difference exists between a pair of coupled oscillator nodes. The differential coupling scheme directly adds the current from the other oscillators, which enables a coherent addition of the input signals to each of the oscillators.

The network 1110 of tunable resistors in FIG. 11 behaves as a differential analog multiply and accumulate circuit that applies signals into input nodes ViL and ViR of each oscillator OSC1-OSC4. The coupling coefficient polarity is controlled by the polarity of the output of a corresponding differential summing amplifier DA1-DA4 (e.g., a Texas Instruments THS4140) to the nodes ViR and ViL of that oscillator OSC1-OSC4. Each differential summing amplifier DA1-DA4 is in parallel with a corresponding feedback resistor, $R_{FB}$ (e.g., $R_{FB}=1$ kΩ). Digital potentiometers (e.g., Analog Devices AD5272) or other tunable resistors R12 through R34 control the individual gains of each of the input oscillator signals.

One advantage of this interconnect differential analog multiply and accumulate circuit 1110 versus a resistive interconnect circuit stems from the ability to scale the number of fully-connected nodes OSC1-OSC4 without adding resistive loading to each oscillator OSC1-OSC4 by using a simple buffer circuit. And unlike with resistive coupling, the quality factor Q for each oscillator OSC1-OSC4 should stay constant as the number of oscillators OSC1-OSC4 because the buffer should protect the oscillators OSC1-OSC4 from the loading effects. The actual gain term is determined by the ratio of the feedback resistor $R_{FB}$ and the digital potentiometers R12 through R34. A processor (depicted as a microcontroller 1200 in FIG. 12) applies digital I2C communication signals to the digital potentiometers R12 through R34. Precise tuning of the bias voltages for the oscillators OSC1-OSC4 and coupling circuit 1110 ensures accurate solution performance of the system 1100.

The analog coupling coefficients from the Ising Hamiltonian ($J_{ij}$) are mapped linearly to the ratio of the gains between the various oscillators OSC1-OSC4. For example, each tunable resistor R12-R34 can have 1024 tap points and a maximum resistance of 20 kΩ. The conversion from the analytical coupling coefficients to the tunable resistor's programmed values ($D_{ij}$), which range from 1 to 1024, is shown the following equation:

$$D_{ij} = \frac{\beta\alpha}{J_{ij}} + \beta(1-\alpha)$$

where $\beta=R_{min}*1024/20$ kΩ and $\alpha$ is the mapping scalar (e.g., $\alpha=2.5$.) In this example, setting the minimum resistance to $R_{min}=760\Omega$ prevents high currents at the summing amplifier at high coupling coefficient values. The mapping from the coupling coefficients, $J_{ij}$, to the resistance values can be scaled based on the $\alpha$ term to increase the dynamic range.

Figure 12:
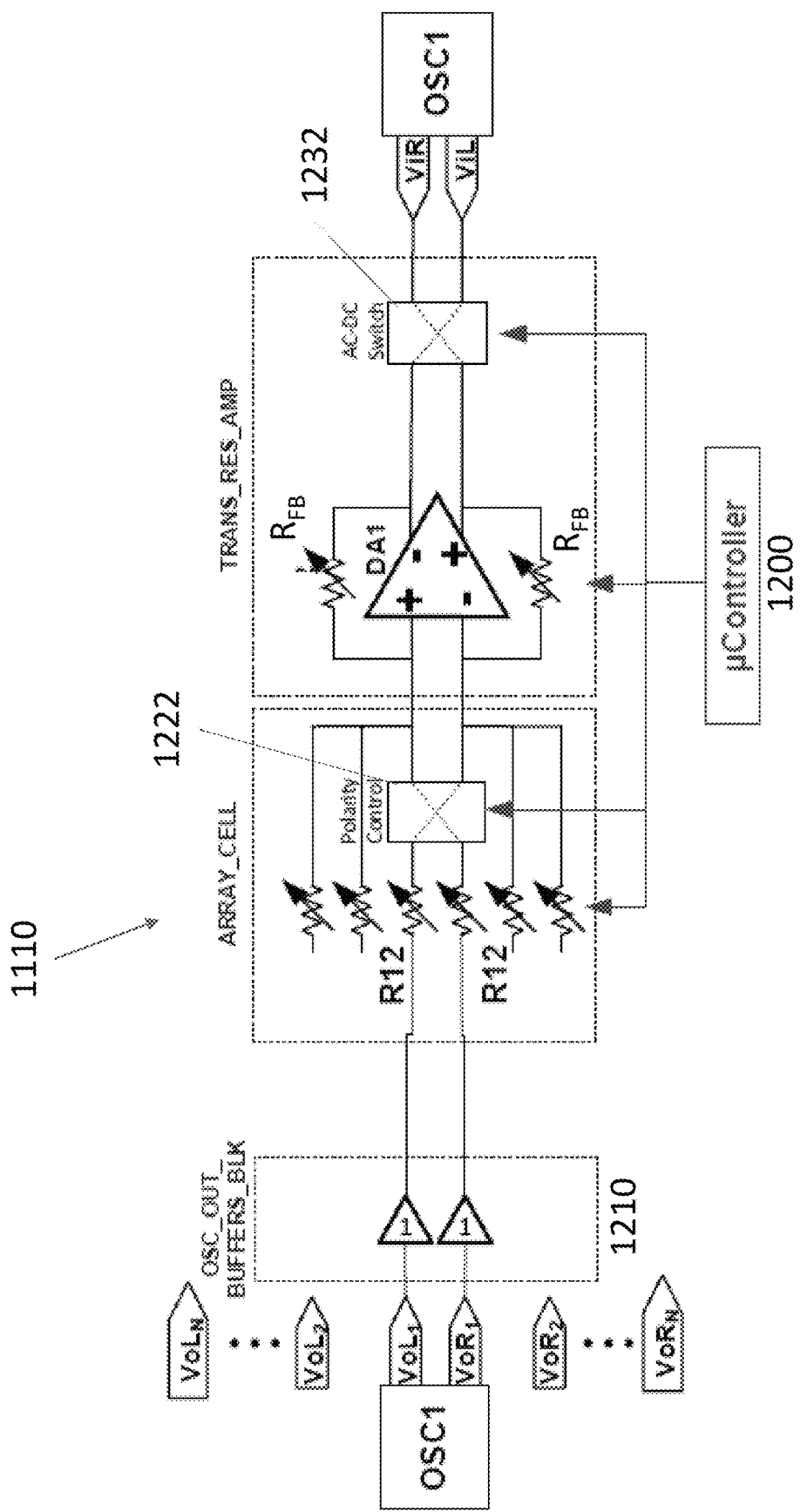
FIG. 12 shows connections and components for the first oscillator OSC1 in the cross-bar interconnect architecture of FIG. 11.

FIG. 12 shows a detailed schematic of one possible circuit implementation of the connections between the coupling circuit 1110 and the first oscillator OSC1 in the crossbar array 1100 of FIG. 11. (The other oscillators in the crossbar array 1100 can be connected using the same implementation.) The outputs $VoL_1$ and $VoR_1$ of the first oscillator OSC1 are connected to an output buffer stage OSC_OUT_BUF-FERS_BLK, which includes a voltage buffer amplifier 1210 for each output to isolate the oscillator OSC1 from the impedance of the cross-bar circuit 1110. The buffer amplifiers 1210 prevent resistive loading on the oscillator OSC1 for large systems, which is beneficial for scalability.

The output buffer stage OSC_OUT_BUFFERS_BLK is connected to the array cell stage ARRAY_CELL, which contains the individual tunable resistors R12-R34 to control the gain of each coupling. These are the same tunable resistors R12-R34 shown in FIG. 11 and are controlled by the microcontroller 1200. Because the oscillator OSC1 is a differential oscillator, there is one tunable resistor R12 for the first oscillator output $VoL_1$ and another tunable resistor R12 for the other oscillator output $VoR_1$.

A polarity switch 1222 coupled to this pair of tunable resistors R12 alternates the connections of the tunable resistor into the corresponding differential amplifier DA1 (also shown in FIG. 11). Specifically, the polarity switch 1222 is actuated by the microcontroller 1200 and controls which terminal into the differential operational amplifier the oscillator signals enter. This switch enables 1222 sign control of the weights. For example, a positive weight of +J12 translates to a direct connection into the differential amplifier DA1. For a weight −J12, the polarity of the input to the differential amplifier DA1 is switched. Although only one polarity control switch 1222 is shown in FIG. 12, there is a polarity control switch for each and every input into the differential amplifier.

The differential amplifier DA1 is coupled in parallel with a corresponding feedback resistor $R_{FB}$ in a final stage TRANS_RES_AMP. The feedback resistor $R_{FB}$ can be implemented as another tunable resistor (e.g., a digital potentiometer) set by the microcontroller 1200 to provide an even larger dynamic range for the weights connecting the oscillators OSC1-OSC4. Also, more differential potentiometers (not shown) can be placed in series to extend the dynamic range even further. Lastly, an AC-DC switch 1232, actuated by the microcontroller 1200, controls if a high-pass filter filters the output of the differential amplifier DA1 before the output is coupled to the inputs ViR and ViL of the first oscillator OSC1. The high-pass filter removes DC bias signals from the summed signal from the other oscillators OSC2-OSC4. This prevents a large DC signal from overloading the receiving oscillator OSC1, which is beneficial for large-scale systems.

Local h-Field Implementation

In the Ising Hamiltonian, there are two input parameters in the equation:

$$H = \sum_{ij}^{V} J_{ij}\sigma_i\sigma_j + \sum_{j}^{V} h_j\sigma_j$$

These input parameters are the weights between the oscillators, $J_{ij}$, and the local field term, $h_j$. The tunable resistors R12-R34 in FIGS. 11 and 12 set the weights between the oscillators (i.e., the $J_{ij}$ terms). The local field term, $h_j$, can be implemented with an additional unidirectional reference node that acts as an input phase reference that defines what is in-phase and out-of-phase.

Figure 13:
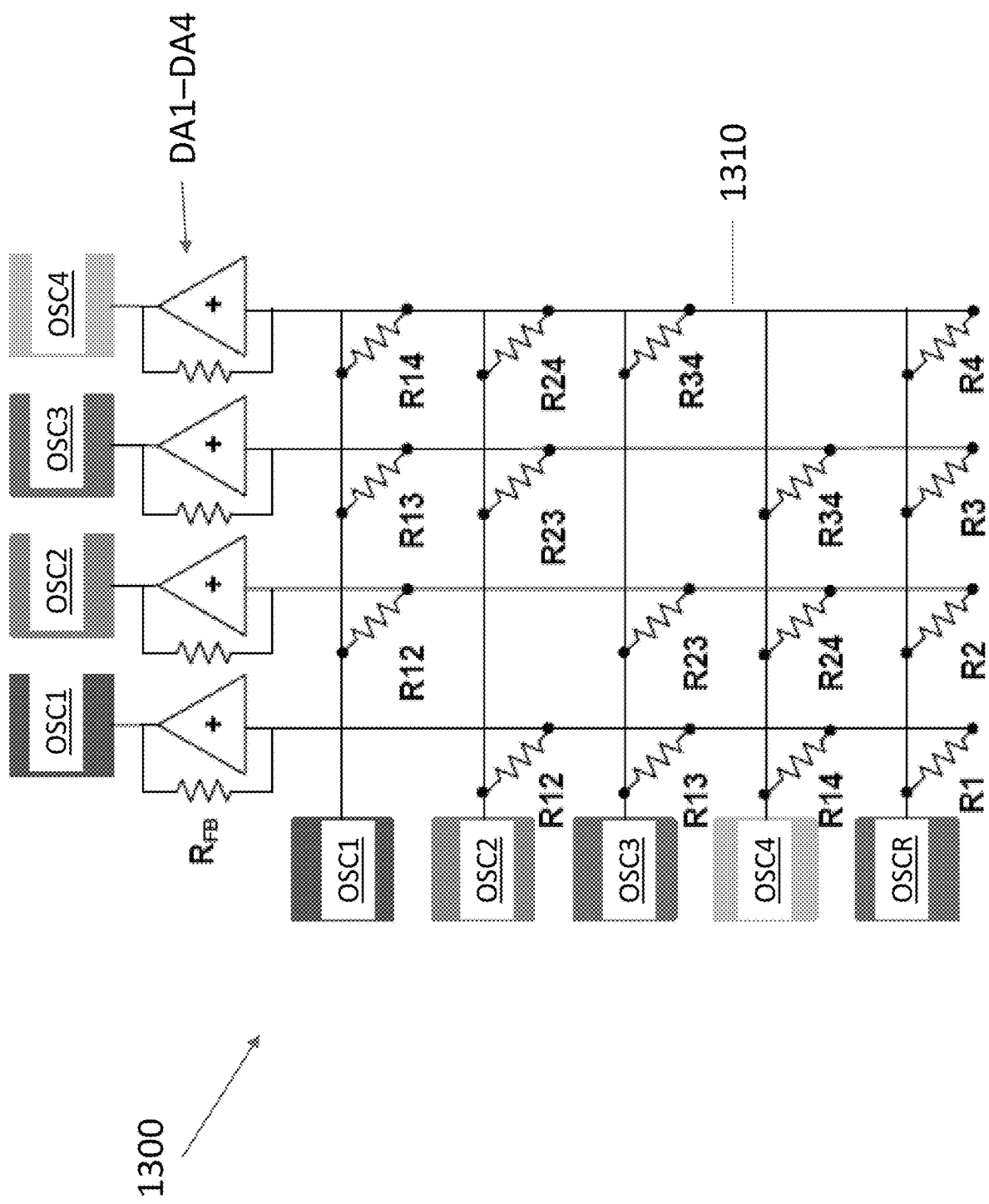
FIG. 13 shows a cross-bar interconnect architecture with a unidirectional reference oscillator for field forcing and latched readout.

FIG. 13 shows a crossbar array 1300 with an additional reference node OSCR. This reference oscillator OSCR is coupled to all of the other oscillators OSC1-OSC4 via tunable resistors R1-R4 in a resistor network 1310. These tunable resistors R1-R4 provide the local field terms, $h_1$, where j=1, 2, 3, 4 in this example. The reference oscillator OSCR transmits a signal to the other oscillators OSC1-OSC4 but does not receive any signals from the other oscillators OSC1-OSC4. As a result, the reference oscillator OSCR provides a phase reference for determining whether the other oscillators OSC1-OSC4 are in phase or out of phase. It also provides a reference for reading the phases of the other oscillators OSC1-OSC4 with a digital readout circuit as explained immediately below.

Digital Readout Circuits and Timing

Figure 14A:
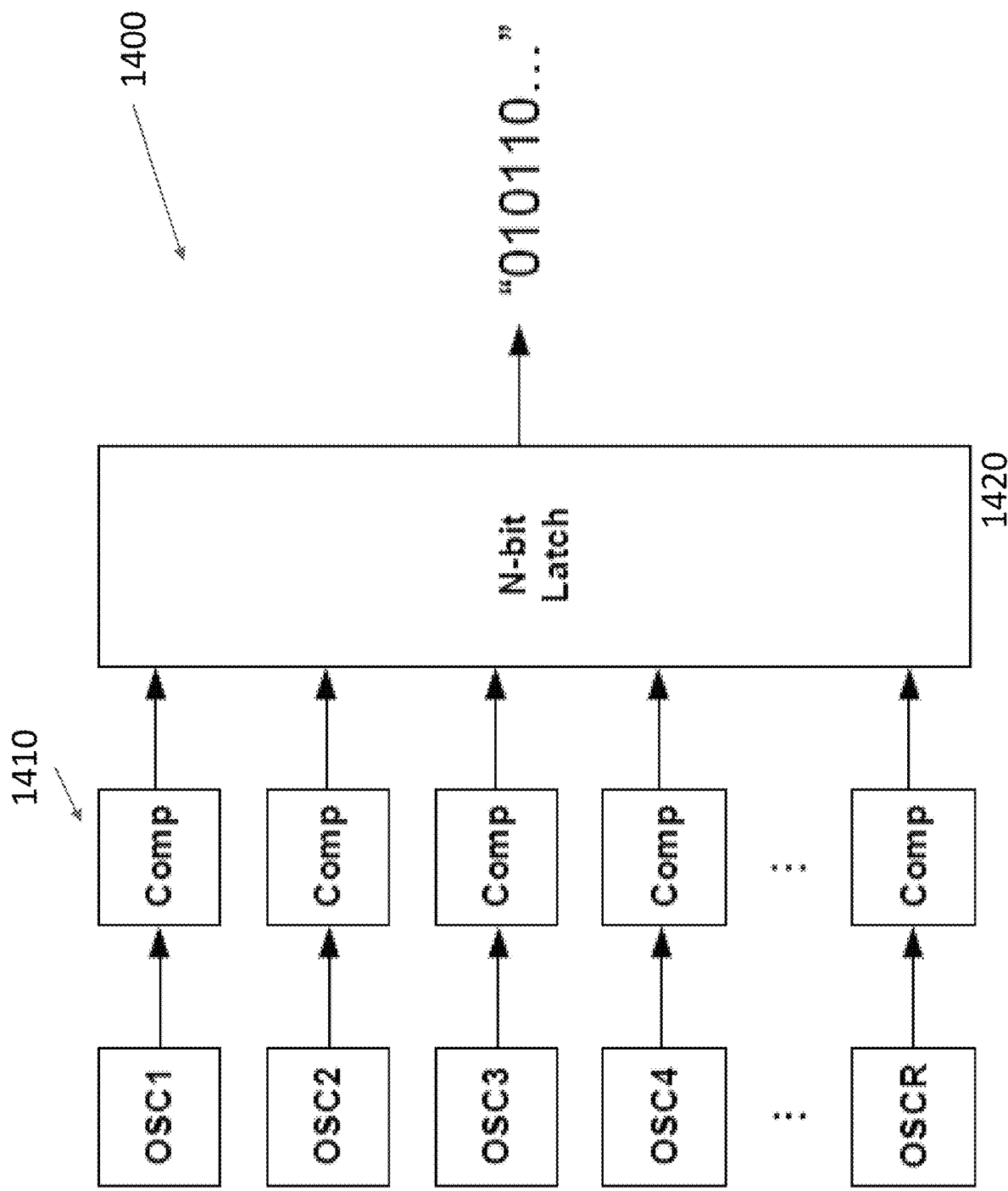
FIG. 14A shows a latched readout system for sensing relative phases of oscillators in a coupled oscillator network, such as the cross-bar interconnect architecture of FIG. 13.
Figure 14B:
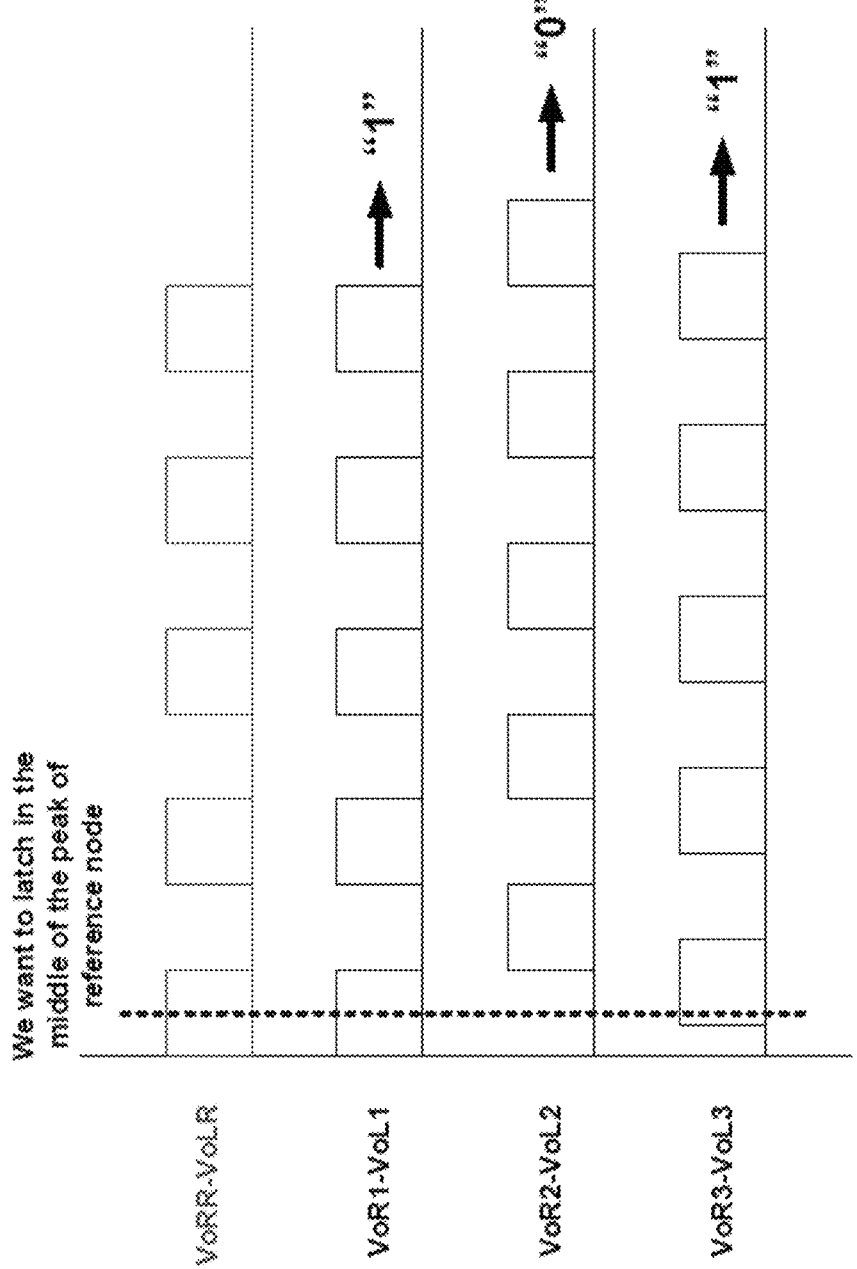
FIG. 14B shows a timing diagram for the latched readout system of FIG. 14A.

FIGS. 14A and 14B illustrate a digital readout circuit 1400 and readout timing, respectively, for reading out the phases of oscillators in an array of oscillators OSC1-OSC4, such as the crossbar array 1300 in FIG. 13. The differential output of each oscillator OSC1-OSC4 is fed into a corresponding digital comparator 1410, which converts the sinusoidal signal from the oscillator into a square wave. The outputs from the comparators 1410 feeds into an N-bit latch 1420, which triggers at a specific time in order to capture the phase of each oscillator. The output of the latch is a bit stream (here, "010110 . . . ") that represents the phases of the oscillators OSC1-OSC4 (e.g., 0 represents out of phase and 1 represents in phase) with respect to the output of a reference oscillator OSCR.

FIG. 14A shows a detailed timing diagram of the latch process performed by the N-bit latch 1420 on the square-wave outputs of the comparators 1410. The reference oscillator OSCR controls the timing of the latch 1420. In a practical system, the phases of the oscillators OSC1-OSC4 may not be exactly 0° or 180° with respect to the output of the reference oscillator OSCR; instead, they may be at relative phases close to these values. To round the relative phases of each oscillator OSC1-OSC4 to either 0° or 180°, the timing of the latch coincides with the center of the reference square wave from the comparator 1410 coupled to the reference oscillator OSCR. Thanks to this latch timing, oscillators OSC1-OSC4 with relative phases near 0° or 180° are rounded to the appropriate binary phases, as shown in the VoR3-VoL3 trace in FIG. 14. To delay the latching, a processor (e.g., microcontroller 1200 in FIG. 12) can output a trigger to the latch 1420 with a controlled delay. In this example, the time of the delay is equal to one-quarter of reference oscillator's oscillation period.

Ring Oscillators and Alternative Coupling Functions

Figure 15B:
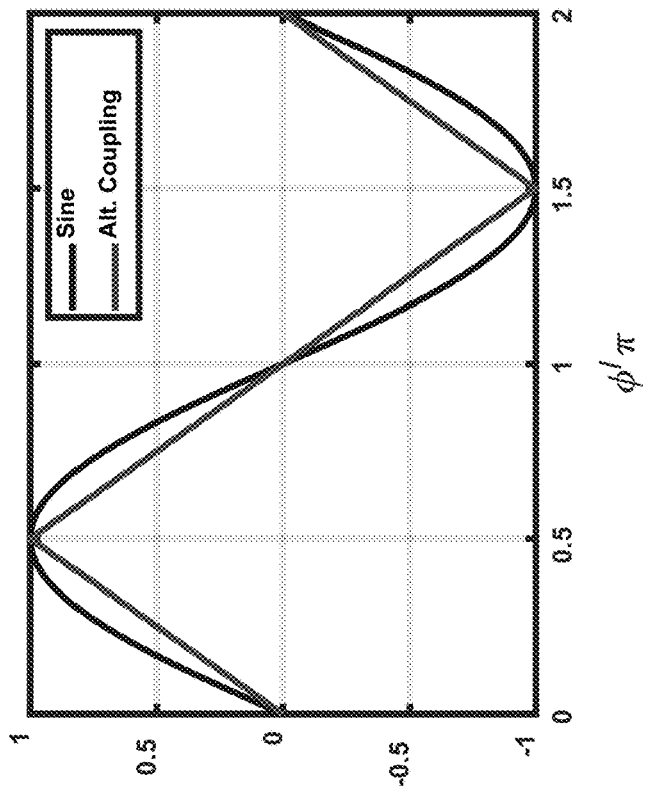
FIG. 15B is a plot of sinusoidal and non-sinusoidal coupling functions suitable for used by oscillators in a coupled oscillator network.
Figure 15A:
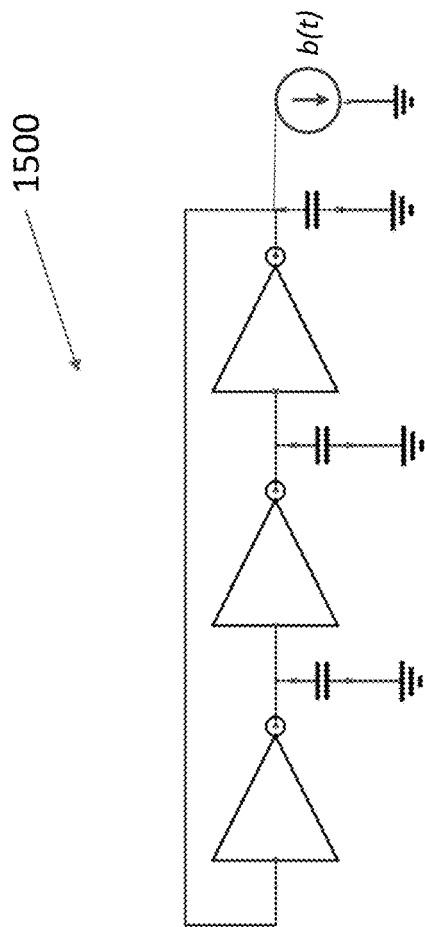
FIG. 15A shows a ring oscillator suitable for use in an integrated circuit coupled oscillator network.

FIG. 15A shows a ring oscillator 1500 that can be used in the coupled oscillator networks disclosed here instead of the circuit shown at left in FIG. 11. The ring oscillator 1500 includes three diodes connected in series and is driven with an injection locking signal b(t). Compared to other electronic oscillators, this ring oscillator 1500 may be easier to implement with integrated circuit technology. Other electronic oscillator designs are also suitable for use in the coupled oscillator networks disclosed here.

The coupled oscillator networks disclosed here can also work with coupling functions (inputs and outputs) that are not sinusoidal. For example, an electronic oscillator may also implement an alternate coupling function that is odd $2\pi$ periodic, such as the piecewise linear function shown in FIG. 15B. Such functions may be more amenable to digital implementation than a conventional sine wave.

Modular Hardware Architecture

Figure 16:
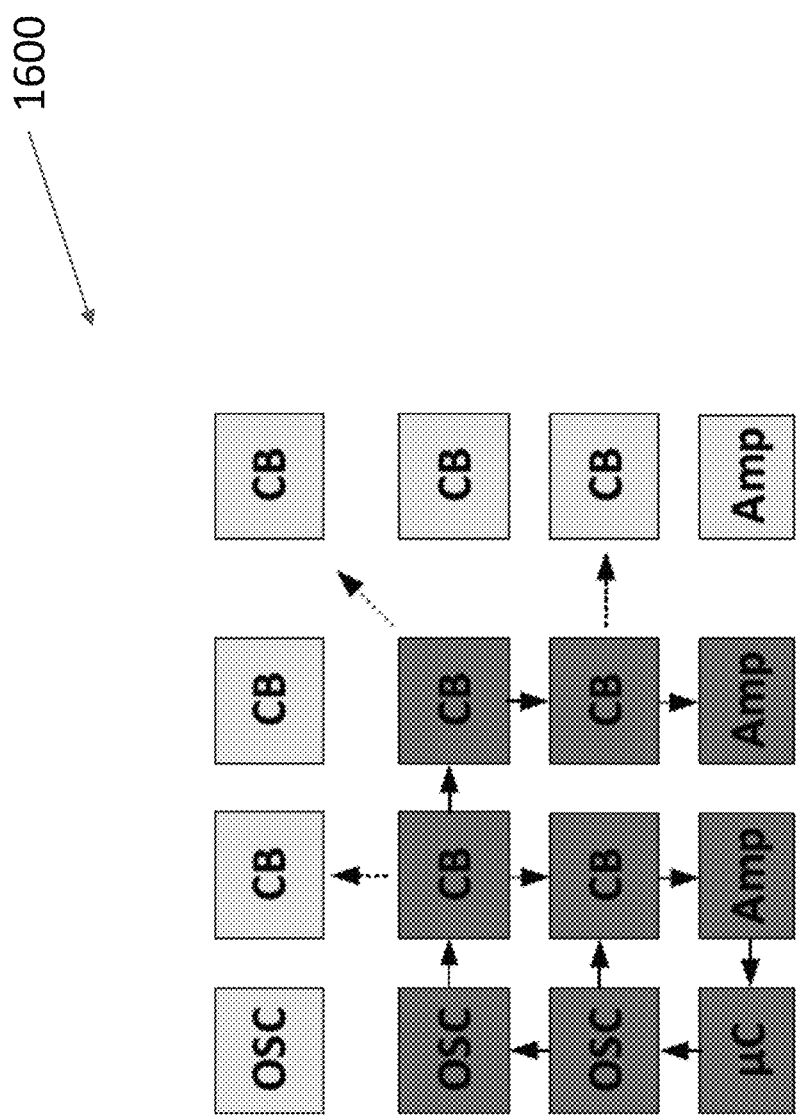
FIG. 16 a modulator oscillator network system that can be scaled to arbitrary size.

FIG. 16 shows a modular oscillator network system 1600. For large system scaling, the physical circuit 1600 can be decomposed into individual physical printed circuit board blocks and can be interconnected with physical cabling. The OSC block contains the oscillators (e.g., oscillators OSC1-OSC4 in FIGS. 11, 13, and 14A), the CB block contains the cross-bar arrays (e.g., resistor networks 1110 and 1310 in FIGS. 11 and 13, respectively), the Amp block contains the summing amplifiers (e.g., DA1-DA4 in FIGS. 11 and 13), and the μC block contains the processor (e.g., microcontroller 1200 in FIG. 12) used to control the system. An advantage of such a scheme is direct scalability without a redesign of the circuit for larger node counts. The modular design also allows replacements of defective segments of the system without replacement of the overall large system. If flexible interconnect cables are used, this system 1600 can be compactly folded in three dimensions.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A system comprising:
   a network of oscillators, wherein each oscillator in the network of oscillators is differentially coupled to each other oscillator in the network of oscillators and emits an oscillatory waveform;
   a reference oscillator, unidirectionally coupled to each oscillator in the network of oscillators, to emit a reference waveform to each oscillator in the network of oscillators; and
   a latching circuit, coupled to the network of oscillators and the reference oscillator, to generate a bit stream representing phases of the oscillatory waveforms with respect to the reference waveform,
   wherein the system comprises a Viterbi decoder and each oscillator in the network of oscillators represents a node in a trellis of the Viterbi decoder, with the oscillators in the network of oscillators that are in-phase representing respective correct message bits and the oscillators in the network of oscillators that are out of phase representing respective incorrect message bits.

2. The system of claim 1, wherein the network of oscillators is configured to solve the Hamiltonian:

$$H = -\sum_{i,j}^{V} J_{ij} s_i s_j - \sum_{i}^{V} h_i s_i$$

where V is the number of oscillators in the network of oscillators, $J_{ij}$ represents a weight of a link interconnecting the $i^{th}$ and $j^{th}$ oscillators in the network of oscillators, represents a relative phase of the $i^{th}$ oscillator in the network of oscillators and can take a value of either +1 or −1, $h_i$ represents a weight of a link connecting the reference oscillator to the $i^{th}$ of oscillator in the network of oscillators, and i and j are integers from 1 to V.

3. The system of claim 1, wherein at least one oscillator in the network of oscillators comprises an electronic ring oscillator.

4. The system of claim 1, wherein the reference waveform is a square wave and the latching circuit is configured to latch the oscillatory waveforms between edges of the square wave.

5. The system of claim 1, further comprising:
   a polarity switch, operably coupled between a pair of oscillators in the network of oscillators, to switch a polarity of a connection between the pair of oscillators.

6. The system of claim 5, further comprising:
   a processor, operably coupled to the polarity switch, to actuate the polarity switch and to control a weight of the connection between the pair of oscillators.

7. A Viterbi decoder comprising:
   interconnected logical oscillators arranged in a trellis having M columns of N interconnected logical oscillators,
   wherein each of the interconnected logical oscillators represents a corresponding node of the trellis, with interconnected logical oscillators that are in-phase representing respective correct message bits and interconnected logical oscillators that are out of phase representing respective incorrect message bits, and
   wherein M and N are positive integers greater than 1.

8. The Viterbi decoder of claim 7, wherein each of the interconnected logical oscillators has a 1/N chance of representing a correct message bit.

9. The Viterbi decoder of claim 7, wherein connections among the interconnected logical oscillators are weighted based on a distance metric defined in the Viterbi decoder.

10. The Viterbi decoder of claim 7, further comprising:
    ancillary oscillators coupled to the interconnected logical oscillators.

11. The Viterbi decoder of claim 10, wherein, in each of column of the trellis, each of the interconnected logical oscillators is connected to each other logical oscillator in the trellis, to at least one of the ancillary oscillators, and to two logical oscillators in an adjacent column of the trellis.

12. The Viterbi decoder of claim 7, wherein the interconnected logical oscillators are emulated in a classical processor.

13. The Viterbi decoder of claim 7, wherein the interconnected logical oscillators are electronic interconnected logical oscillators.

14. A system comprising:
    a network of electronic oscillators, wherein each electronic oscillator in the network of electronic oscillators is differentially coupled to each other electronic oscillator in the network of electronic oscillators with a weight selected to cause the network of electronic oscillators to perform a Boolean logic operation,
    wherein the Boolean logic operation is an AND operation performed on a first input at a first electronic oscillator in the network of electronic oscillators and a second input at a second electronic oscillator in the network of electronic oscillators to yield an output at a third electronic oscillator in the network of electronic oscillators.

15. A system comprising:
    a network of electronic oscillators, wherein each electronic oscillator in the network of electronic oscillators is differentially coupled to each other electronic oscillator in the network of electronic oscillators with a weight selected to cause the network of electronic oscillators to perform a Boolean logic operation,
    wherein the network of electronic oscillators is further configured to factor a number input at a third electronic oscillator in the network of electronic oscillators into factors output at a first electronic oscillator in the network of electronic oscillators and a second electronic oscillator in the network of electronic oscillators.

* * * * *